United States Patent
Takagi et al.

(10) Patent No.: US 8,183,651 B2
(45) Date of Patent: May 22, 2012

(54) MEMS SENSOR, METHOD OF MANUFACTURING MEMS SENSOR, AND ELECTRONIC APPARATUS

(75) Inventors: Shigekazu Takagi, Shimosuwa (JP); Akira Sato, Fujimi (JP)

(73) Assignee: Seiko Epson Corporation (JP)

( * ) Notice: Subject to any disclaimer, the term of this patent is extended or adjusted under 35 U.S.C. 154(b) by 157 days.

(21) Appl. No.: 12/762,530

(22) Filed: Apr. 19, 2010

(65) Prior Publication Data

US 2010/0270596 A1      Oct. 28, 2010

(30) Foreign Application Priority Data

Apr. 24, 2009   (JP) ................................. 2009-106039
Feb. 26, 2010   (JP) ................................. 2010-041693

(51) Int. Cl.
*H01L 29/84*       (2006.01)
(52) U.S. Cl. ................. 257/415; 257/417; 257/E29.324
(58) Field of Classification Search .......... 257/415–420, 257/E29.324
See application file for complete search history.

(56) References Cited

U.S. PATENT DOCUMENTS

| | | | |
|---|---|---|---|
| 7,402,449 B2 | 7/2008 | Fukuda et al. | |
| 7,977,757 B2* | 7/2011 | Yoshikawa et al. | 257/419 |
| 2009/0049911 A1 | 2/2009 | Fukuda et al. | |
| 2009/0064785 A1 | 3/2009 | Fukuda et al. | |
| 2010/0244160 A1* | 9/2010 | Kanemoto | 257/415 |
| 2011/0115038 A1* | 5/2011 | Kanemoto | 257/418 |
| 2011/0278684 A1* | 11/2011 | Kasai | 257/416 |

FOREIGN PATENT DOCUMENTS

JP      2006-263902      10/2006

* cited by examiner

*Primary Examiner* — Thanh Nguyen
(74) *Attorney, Agent, or Firm* — Harness, Dickey & Pierce, P.L.C.

(57) ABSTRACT

A MEMS sensor includes: a substrate; a fixed electrode portion formed in the substrate; a movable weight portion formed above the fixed electrode portion via a gap; a movable electrode portion formed in the movable weight portion and disposed so as to face the fixed electrode portion; a supporting portion; and a connecting portion that couples the supporting portion with the movable weight portion and is elastically deformable, wherein the movable weight portion is a stacked structure having conductive layers and an insulating layer, and plugs having a larger specific gravity than the insulating layer are embedded in the insulating layer.

11 Claims, 16 Drawing Sheets

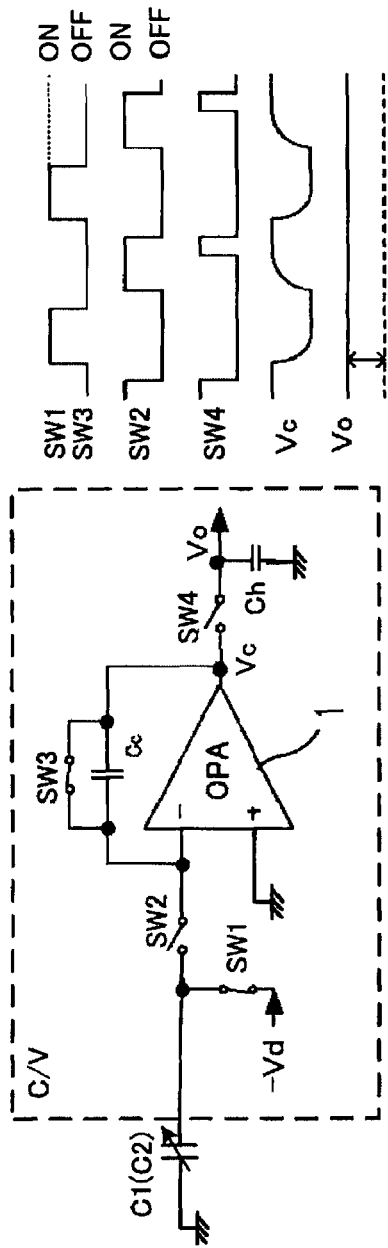
FIG. 6A
FIG. 6B
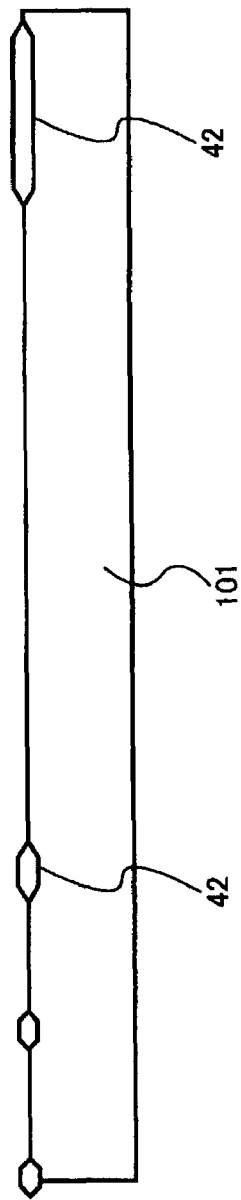
FIG. 7

MEMS SENSOR, METHOD OF MANUFACTURING MEMS SENSOR, AND ELECTRONIC APPARATUS

BACKGROUND

1. Technical Field

The present invention relates to a MEMS (Micro Electro Mechanical System) sensor, a method of manufacturing the MEMS sensor, an electronic apparatus, and the like.

2. Related Art

As a silicon MEMS acceleration sensor with a CMOS integrated circuit for example, a reduction in size and cost for this type of MEMS sensor is rapidly progressing. The application and market of the MEMS sensor are expanding. In a main device form, an IC chip that converts a physical quantity into an electric signal and outputs the same is made into one package by a mounting process after a wafer process in most cases. For achieving an extreme reduction in size and cost, a technique of integrally forming a sensor chip and an IC chip by a wafer process is required (refer to JP-A-2006-263902).

This type of MEMS sensor has such characteristics that sensitivity is enhanced as the mass of a movable weight portion increases. For increasing the mass of the movable weight portion, in JP-A-2006-263902, the movable weight portion is formed of an integral structure including multi-layer wiring that is formed simultaneously with a multi-layer wiring layer of an LSI (paragraph 0089 and FIG. 25).

The movable weight portion vibrates in a Z-direction that is perpendicular to a substrate. The movable weight portion is formed only of the wiring layer. Since all inter-layer insulating layers are removed, the once formed inter-layer insulating layers cannot be used as a weight.

In FIG. 39 of JP-A-2006-263902, a structure in which the periphery of a multi-layer wiring structure is covered with an insulating film is disclosed (refer to paragraph 0114). In FIG. 39 of JP-A-2006-263902, however, since a conductive layer below the movable weight portion is removed by etching, only two layers of the multi-layer wiring in the movable weight portion can be used. In addition, also an inter-layer insulating layer between the two wiring layers cannot be used as a weight.

SUMMARY

An advantage of some aspects of the invention is to provide a MEMS sensor (for example, electrostatic capacitive acceleration sensor) in which the mass of a movable weight portion capable of moving in a direction perpendicular to a substrate can be efficiently increased, and a method of manufacturing the MEMS sensor, to provide a MEMS sensor that can detect a physical quantity such as acceleration with high accuracy, for example, and to provide a MEMS sensor that can be manufactured freely and easily by using a CMOS process in which multi-layer wiring is used, for example.

A first aspect of the invention relates to a MEMS sensor including: a movable weight portion including a movable electrode portion; a fixed electrode portion fixed so as to have a facing-electrode face that faces a movable-electrode face of the movable electrode portion; a supporting portion disposed around the movable weight portion via a gap portion; and an elastically deformable connecting portion that supports the movable weight portion by coupling to the supporting portion and varies the facing distance between the facing-electrode face and the movable-electrode face. The movable weight portion has a stacked structure including a plurality of conductive layers, an inter-layer insulating layer disposed between the plurality of conductive layers, and a plug that is filled into an embedding groove pattern formed to penetrate through the inter-layer insulating layer and has a larger specific gravity than the inter-layer insulating film. The plug includes a wall portion formed in a wall shape along at least one axial direction on a two-dimensional surface parallel to the inter-layer insulating layer, one of the plurality of conductive layers is the movable electrode portion having the movable-electrode face, and the movable weight portion moves in a Z-direction in which the layers are stacked in the stacked structure.

In an embodiment, a MEMS sensor includes: a substrate; a fixed electrode portion formed the substrate; a movable weight portion formed above the fixed electrode portion via a gap; a movable electrode portion formed the movable weight portion and disposed so as to face the fixed electrode portion; a supporting portion; and a connecting portion that couples the supporting portion with the movable weight portion and is elastically deformable. The movable weight portion is a stacked structure having conductive layers and an insulating layer, and plugs having a larger specific gravity than the insulating layer are embedded in the insulating layer. The plugs are conductive materials and formed to penetrate through the insulating layer, and the conductive layers are connected to each other with the plugs. The movable weight portion has a plane including a first direction and a second direction orthogonal to the first direction in a plan view, and the plug is formed to be line-symmetric with respect to both the first direction and the second direction. The movable weight portion has a through hole that penetrates from an uppermost layer to a lowermost layer, and the plug is formed close to the through hole.

According to the aspect of the invention, the movable weight portion that is supported by coupling to the supporting portion via the connecting portion includes the movable electrode portion. Based on the fact that the facing distance between the movable-electrode face of the movable electrode portion and the facing-electrode face of the fixed electrode portion changes, the magnitude and direction of a physical quantity in the Z-direction perpendicular to the facing-electrode face can be detected from, for example, the relation between the magnitude and increase or decrease of a capacitance depending on the distance between the electrodes. In this case, the movable weight portion that can decrease sensitivity noise as the mass thereof increases can be formed as the stacked structure in which the plurality of conductive layers, the inter-layer insulating layer, and the plugs are closely stacked. Especially the plug having a large specific gravity in each of the layers is formed to have a columnar shape or a prismatic shape when the plug serves only for connection. However, since the plug is formed so as to include the wall portion formed in a wall shape along at least one axial direction on the two-dimensional surface parallel to the inter-layer insulating layer, the plug can contribute to an increase in the mass of the movable weight portion per unit area. Since the stacked structure constituting the movable weight portion can be formed by a typical CMOS process, the MEMS sensor can easily coexist with an integrated circuit portion on the same substrate. Moreover, since a multi-layer conductive layer is relatively easily formed, the degree of design freedom is high. For example, the demand for noise reduction of an acceleration sensor can be met by increasing the number of layers and increasing the mass of the movable weight portion.

The plugs are formed to be line-symmetric with respect to both the first direction and the second direction orthogonal to the first direction of the movable weight portion in a plan view, so that the movable balance of the movable weight portion is enhanced, and detection sensitivity can be further improved. The movable weight portion has the through hole for removing a lower layer by etching. By forming the plugs close to the through hole, the mass that is reduced by forming the through hole can be supplemented, and the detection sensitivity can be further improved.

In the aspect of the invention, the MEMS sensor further includes a substrate on which the stacked structure is formed, and an integrated circuit portion formed on the substrate, wherein the plurality of conductive layers, the inter-layer insulating layer, and the plugs of the stacked structure can be manufactured by the manufacturing process of the integrated circuit portion.

As described above, since the stacked structure of the movable weight portion is suitable for a CMOS process, the MEMS sensor can be mounted together with the integrated circuit portion on the same substrate. This makes it possible to reduce a manufacturing cost compared to the case of manufacturing and assembling the respective ones in different processes. Further, the CMOS integrated circuit portion and the MEMS structure are formed monolithically, so that the wiring distance can be shortened. Therefore, it can be expected that a loss component due to the routing of the wiring will be reduced, and that resistance to external noise will be improved.

In the aspect of the invention, the fixed electrode portion can be formed of an impurity layer formed in the substrate. Accordingly, a first conductive layer (generally the same layer as a gate electrode) formed on the substrate is etched to form a second gap portion. Therefore, a second conductive layer and layers on the second conductive layer formed above the substrate can be used as the stacked structure, making it possible to increase the mass of the movable weight portion. Moreover, a polysilicon layer for forming the gate electrode of a transistor can be thin. When the polysilicon layer is etched to form the second gap portion, the gap between the electrodes forming a capacitance can be made small. Therefore, an electrode area for ensuring a predetermined capacitance can be made small, which contributes to the miniaturization of the MEMS sensor.

In the aspect of the invention, in the integrated circuit portion, N (N is an integer of 3 or more) conductive layers are formed on the substrate. When the order of the N conductive layers from the side close to the substrate is defined as n ($1 \leq n \leq N-3$), the fixed electrode portion can be formed of the material of the conductive layer of an nth layer formed in the integrated circuit portion, and the movable electrode portion can be formed of the material of the conductive layer of an (n+2)th layer. In a manufacturing method, the conductive layers of three or more layers are formed, and when the stacked order of the conductive layers from the substrate side is defined as n, the conductive layer of an (n+1)th layer is removed in forming the gap, the conductive layer of the nth layer is used for the fixed electrode portion, and the conductive layer of the (n+2)th layer is used for the movable electrode portion.

In the aspect, since the impurity layer formed in the substrate is not included in the N conductive layers, it is defined that the fixed electrode is formed of a layer other than the impurity layer. The conductive layer of the (n+1)th layer is etched to form the second gap portion, so that the fixed electrode portion of the nth layer and the movable electrode portion of the (n+2)th layer can face each other to form a variable capacitance.

In this case, the fixed electrode portion can be formed of the material of the gate electrode of the transistor formed in the integrated circuit portion. The gate is the conductive layer of the first layer on the substrate (example of n=1), and the second layer is etched, so that a stacked structure can be formed to include the conductive layer of the third layer.

In addition, the fixed electrode portion may be formed of a wiring material above the gate electrode of the transistor formed in the integrated circuit portion. In this case, the fixed electrode portion is not necessarily a metal wiring layer. In an example of a polysilicon multi-layer, a polysilicon layer other than a gate electrode (first layer) polysilicon may be used as the fixed electrode portion.

In the aspect of the invention, at least one of the movable-electrode face and the facing-electrode face, which is positioned on the second gap portion side, may be covered with an insulating layer formed by using a manufacturing process of the integrated circuit portion. This prevents the electrodes that form a capacitance from being in direct contact with each other to cause short. Moreover, by leaving an insulating layer in a lowermost layer of the movable electrode portion, the mass of the movable electrode portion can be increased.

In the aspect of the invention, in addition to the Z-direction orthogonal to the two-dimensional surface parallel to the substrate, the connecting portion movably supports the movable weight portion in at least one direction of orthogonal two axes X and Y on the two-dimensional surface. The stacked structure of the movable weight portion includes a protruding movable electrode portion protruding in the at least one direction, and the supporting portion can have a protruding fixed electrode portion facing the protruding movable electrode portion. The MEMS sensor further includes a second movable electrode portion having an arm shape and extending from the movable weight portion, and a second fixed electrode portion having an arm shape, extending from the supporting portion, and disposed so as to face the second movable electrode portion. With this configuration, a physical quantity in one or both of the X- and Y-directions can be detected in addition to the Z-direction. In an embodiment, an electronic apparatus having mounted thereon the MEMS sensor is provided.

In the aspect of the invention, the MEMS sensor can include a fixed portion fixed to the substrate, a first movable weight portion that can move relative to the fixed portion via a first connecting portion, and a second movable weight portion that can move relative to the first movable weight portion via a second connecting portion. In this case, when it is assumed that one of the first movable weight portion and the second movable weight portion serves as the movable weight portion, that one of the first connecting portion and the second connecting portion serves as the connecting portion, that one of the fixed portion and the first movable weight portion serves as the supporting portion, and that one of the first connecting portion and the second connecting portion deforms in the Z-direction orthogonal to the two-dimensional surface parallel to the substrate, a physical quantity in the Z-direction can be detected. In addition, it is assumed that the other of the first connecting portion and the second connecting portion deforms in at least one direction of orthogonal two axes X and Y on the two-dimensional surface. When the other of the first movable weight portion and the second movable weight portion includes a protruding movable electrode portion protruding in at least one direction of the orthogonal two axes X and Y on the two-dimensional surface, and the other of the fixed portion and the first movable weight portion has a protruding fixed electrode portion facing the protruding movable electrode portion, a physical quantity in one or both of the X- and Y-directions can be detected in addition to the Z-direction.

That is, when the second movable weight portion serves as a movable weight portion that is displaced in the Z-direction relative to the first movable weight portion (supporting portion), the second connecting portion functions as a connecting portion that elastically deforms in the Z-direction. In this case, the first movable weight portion is displaced in one or both of the X- and Y-directions with the first connecting portion relative to the fixed portion, contributing to the detection of a physical quantity in one or both of the X- and Y-directions. Conversely, when the first movable weight portion serves as a movable weight portion that is displaced in the Z-direction relative to the fixed portion (supporting portion), the first connecting portion functions as a connecting portion that elastically deforms in the Z-direction. In this case, the second movable weight portion is displaced in one or both of the X- and Y-directions with the second connecting portion relative to the first movable weight portion, contributing to the detection of a physical quantity in one or both of the X- and Y-directions. Further, when the MEMS sensor according to the aspect of the invention is used for an electronic apparatus, an electronic apparatus having detection sensitivity improved in the Z-direction can be provided.

A second aspect of the invention relates to a method of manufacturing a MEMS sensor including: forming, on a substrate, a stacked structure including a plurality of conductive layers, an inter-layer insulating layer disposed between the plurality of conductive layers, and a plug that is filled into an embedding groove pattern formed to penetrate through the inter-layer insulating layer and has a larger specific gravity than the inter-layer insulating film, the plug including a wall portion formed in a wall shape along at least one axial direction on a two-dimensional surface parallel to the inter-layer insulating layer; anisotropically etching the stacked structure to form a first gap portion around the stacked structure; and isotropically etching one of the plurality of conductive layers in the stacked structure with an etchant for isotropic etching supplied via at least the first gap portion to form a second gap portion below the stacked structure. In an embodiment, a method of manufacturing a MEMS sensor including a substrate, a fixed electrode portion formed the substrate, a movable weight portion formed above the fixed electrode portion via a gap, a movable electrode portion formed the movable weight portion and disposed so as to face the fixed electrode portion, a supporting portion, and a connecting portion that couples the supporting portion with the movable weight portion and is elastically deformable, includes: forming, on the substrate, a stacked structure in which conductive layers and an insulating layer are stacked; forming groove in the insulating layer to fill plug having a larger specific gravity than the insulating layer into the groove; forming a cavity from an uppermost layer of the stacked structure to the surface of the substrate by anisotropic etching; and isotropically etching at least one of the conductive layer and the insulating layer via the cavity to form the gap between the substrate and the stacked structure, wherein the fixed electrode portion and the movable electrode portion are formed by using the conductive layer.

According to the second aspect of the invention, the MEMS sensor according to the first aspect of the invention can be preferably manufactured by combining anisotropic etching and isotropic etching.

BRIEF DESCRIPTION OF THE DRAWINGS

The invention will be described with reference to the accompanying drawings, wherein like numbers reference like elements.

FIGS. 6A and 6B explain the configuration and operation of a C/V conversion circuit (charge amplifier).

FIG. 7 schematically shows the manufacturing process of the acceleration sensor module according to the first embodiment of the invention, showing a forming step of a field oxide film.

DESCRIPTION OF EXEMPLARY EMBODIMENTS

Hereinafter, preferred embodiments of the invention will be described in detail. The embodiments described below are not intended to unreasonably limit the content of the invention set forth in the claims. Also, not all of the configurations described in the embodiments are essential as solving means.

1. First Embodiment

In a first embodiment, the invention is applied to an acceleration sensor module for a Z-direction that is a vertical direction of a substrate, and a sensor chip and an IC chip are integrally formed by a wafer process.

1.1. MEMS Sensor

Figure 1:
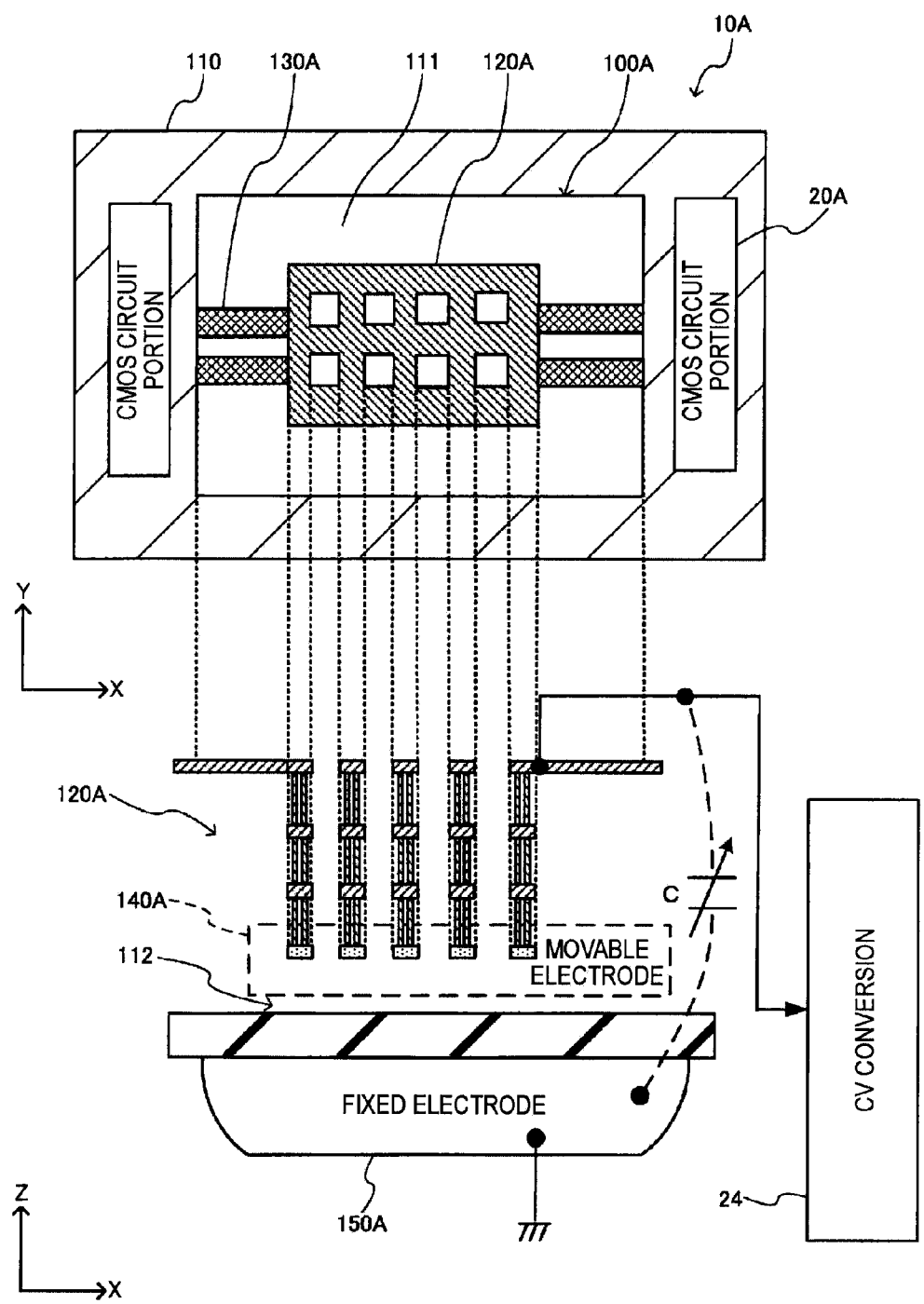
FIG. 1 is a schematic view of an acceleration sensor module according to a first embodiment of the invention.

FIG. 1 is a schematic view of an acceleration sensor module 10A having mounted thereon a MEMS portion 100A according to the first embodiment to which a MEMS sensor of the invention is applied. The MEMS portion 100A according to the first embodiment has, for example, a movable weight portion 120A including a movable electrode portion 140A, a supporting portion 110 disposed around the movable weight portion 120A via first gap portions 111, a fixed electrode portion 150A having a facing-electrode face that faces a movable-electrode face of the movable electrode portion 140A via a second gap portion 112, and elastically deformable connecting portions 130A that support the movable weight portion 120A by coupling to the supporting portion 110 and can change the facing distance between the facing-electrode face and the movable-electrode face. In the embodiment, the moving direction of the movable weight portion 120A is a Z-direction orthogonal to a two-dimensional coordinate XY plane in FIG. 1.

1.2. Movable Weight Portion

Figure 2A:
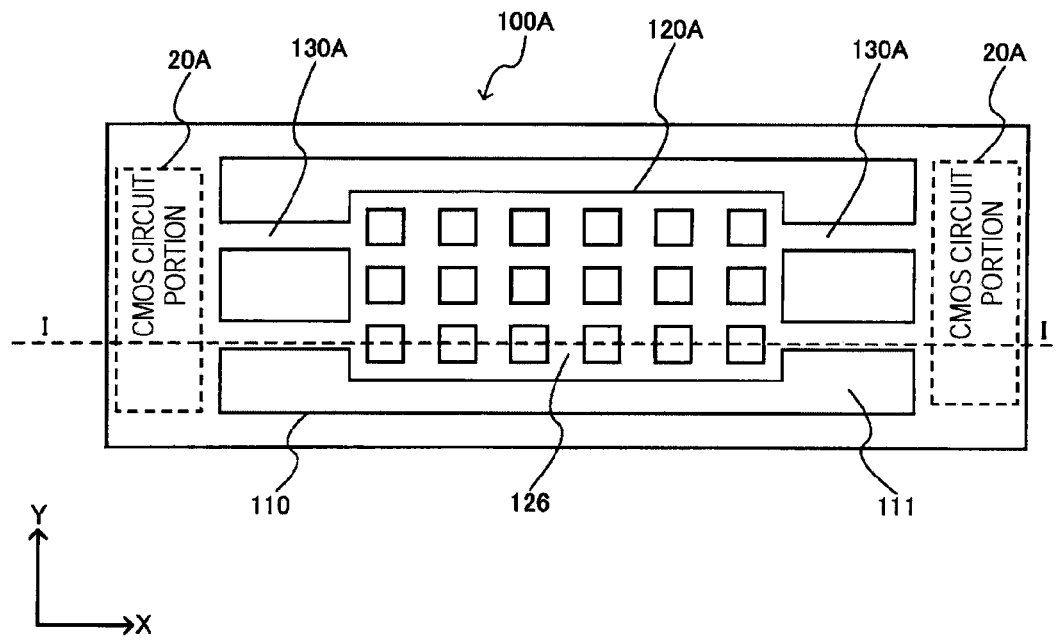
FIG. 2A is a plan view of the acceleration sensor module according to the first embodiment of the invention.
Figure 2B:
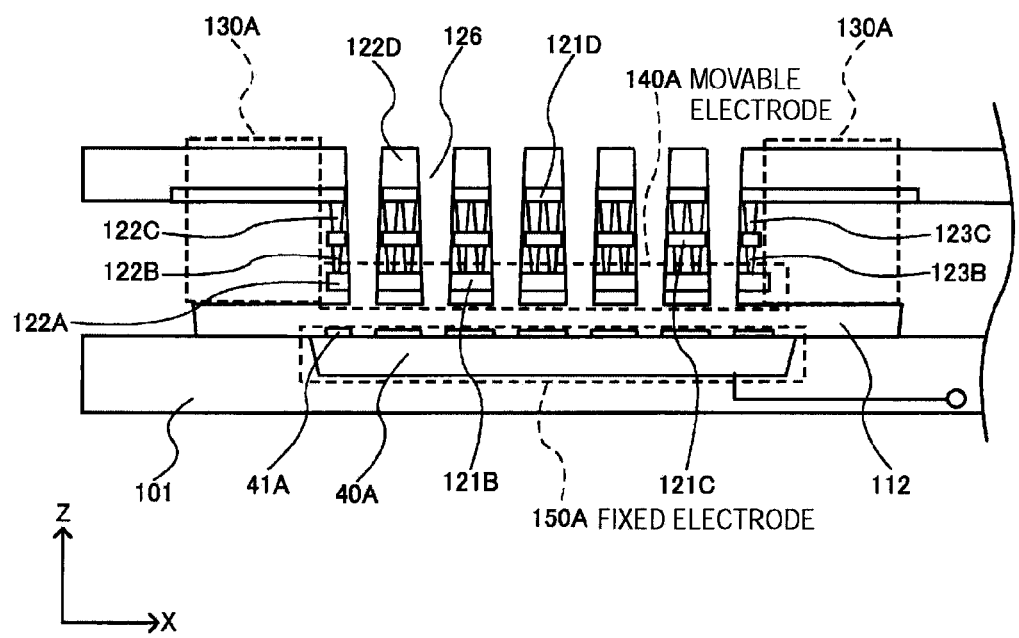
FIG. 2B is a cross-sectional view taken along line I-I of FIG. 2A.

FIG. 2A is a schematic plan view of the acceleration sensor module 10A having mounted thereon the MEMS portion 100A according to the first embodiment to which the MEMS sensor of the invention is applied. FIG. 2B is a cross-sectional view taken along line I-I of FIG. 2A. On the acceleration sensor module 10A, integrated circuit portions (CMOS circuit portions) 20A are mounted together with the MEMS portion 100A. The MEMS portion 100A can be formed also by using manufacturing process steps of the integrated circuit portion 20A.

The MEMS portion 100A has the movable weight portion 120A movably supported by the connecting portions 130A in the Z-direction in the first gap portions 111 inside the fixed frame portion (supporting portion in the broad sense) 110. The movable weight portion 120A has a predetermined mass. For example, when acceleration acts on the movable weight portion 120A in the Z-direction in a state where the movable weight portion 120A is stopped, force in a direction opposite to the acceleration acts on the movable weight portion 120A to move the movable weight portion 120A.

Figure 3:
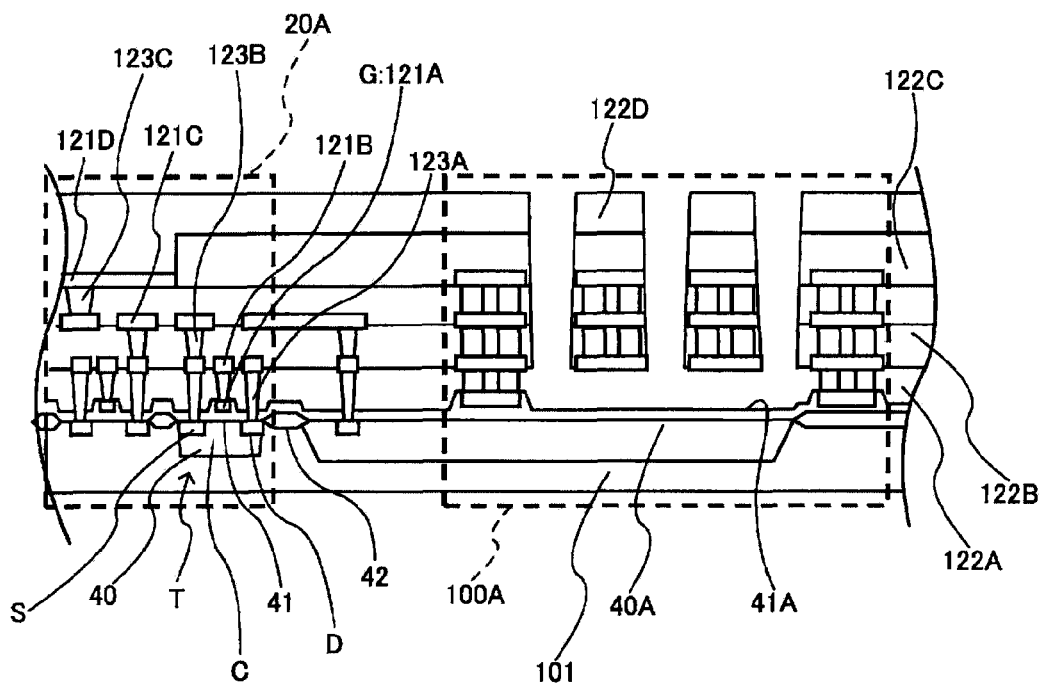
FIG. 3 is a cross-sectional view of an integrated circuit portion formed integrally with a MEMS sensor.

Before describing the structure of the movable weight portion 120A, the integrated circuit portion 20A will be described with reference to FIG. 3. In FIG. 3, an impurity layer, for example, an N-type well 40 is formed on a substrate, for example, a P-type semiconductor substrate 101 of FIG. 2A, and a source S, a drain D, and a channel C are formed in the well 40. A gate electrode G (also referred to as a conductive layer 121A) is formed above the channel C via a gate oxide film 41. In a field region for device isolation, a thermal oxide film 42 is formed as a field oxide film. In this manner, a transistor T is formed on the silicon substrate 101, and wiring is made for the transistor T, so that the CMOS integrated circuit portion 20A is completed. In FIG. 2B, with conductive layers 121B to 121D formed between inter-layer insulating layers 122A to 122C and plugs 123A to 123C, wiring is made for the source S, drain D, and gate G of the transistor T. A protective layer 122D is formed in the uppermost layer.

As shown in FIG. 2B, the movable weight portion 120A includes the conductive layers 121B to 121D, the inter-layer insulating layers 122B and 122C respectively disposed between the conductive layers 121B to 121D, and the plugs 123B and 123C filled into embedding groove patterns that are respectively formed through the inter-layer insulating layers 122B and 122C. The conductive layer 121A is not present in the movable weight portion 120A. Since the conductive layer 121A is removed, the second gap portion 112 is formed below the conductive layer 121B of the lowermost layer. In the embodiment, the conductive layer 121B of the lowermost layer serves as the movable electrode portion 140A. Moreover, also the plug 123A is no more required because the conductive layer 121A is not formed in the movable weight portion 120A. However, the plug 123A may be formed for the purpose of increasing the mass of the movable weight portion 120A. In the movable electrode portion 140A, the inter-layer insulating layer 122A may be present below the conductive layer 121B.

The predetermined embedding groove pattern formed through each of the inter-layer insulating layers 122B and 122C is a grid-like pattern, for example, and the plugs 123B and 123C are formed in a grid. For the material of the plugs 123B and 123C, a necessary condition is that the material is greater in specific gravity than the inter-layer insulating films 122A to 122C. When the plugs 123B and 123C are used also for electrical continuity, a conductive material is used.

In the embodiment, the conductive layer 121A of the lowermost layer above the substrate 101 is, for example, a polysilicon layer formed on an insulating film 124 on the silicon substrate 101 in the integrated circuit portion 20A. The other three conductive layers 121B to 121D are metal layers, for example, Al layers. The plugs 123A to 123C are formed of metal, for example, tungsten.

Figure 4:
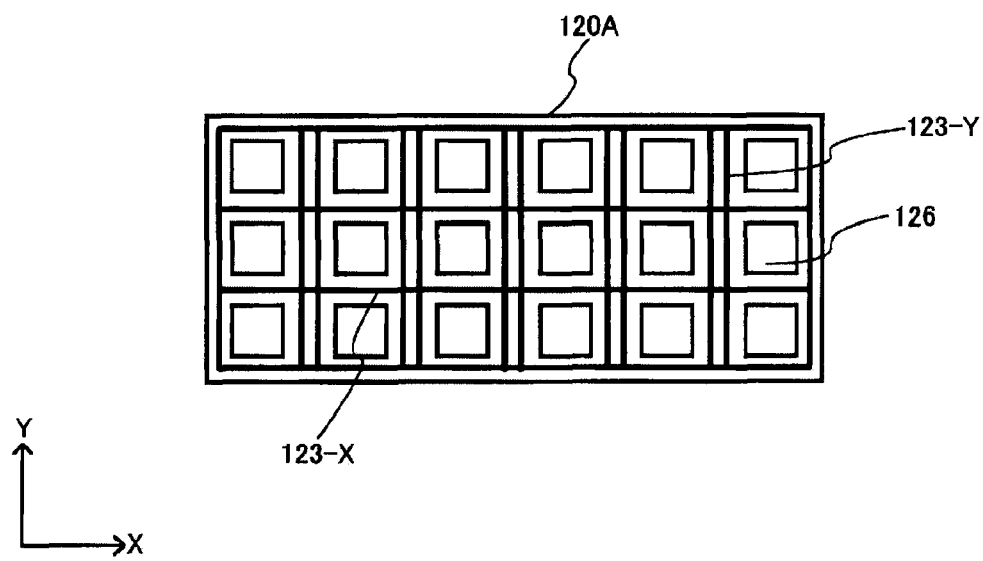
FIG. 4 is a horizontal cross-sectional view of plugs disposed in a movable weight portion.

The plugs 123B and 123C formed in the respective layers of the movable weight portion 120A include wall portions formed in a wall shape along at least one axial direction of a two-dimensional surface parallel to the inter-layer insulating layers 122B and 122C. As shown in FIG. 4 which is a horizontal cross-section of the movable weight portion 120A, orthogonal two axes of the two-dimensional surface are defined as an X-direction and a Y-direction. In the embodiment, the plugs 123B and 123C formed in the respective layers include plugs 123-X extending in a wall shape along the X-direction as a longitudinal direction and plugs 123-Y extending in a wall shape along the Y-direction as a longitudinal direction. As shown in FIG. 4, the plugs 123B and 123C are formed to be line-symmetric with respect to both the X-direction and the Y-direction. That is, the movable weight portion 120A has, in a plan view, a plane including a first direction (for example, the X-direction) and a second direction (for example, the Y-direction) orthogonal to the first direction, and the plugs 123B and 123C are formed to be line-symmetric with respect to both the first direction and the second direction. The "plan view" used herein means a two-dimensional coordinate XY plane, for example. The first direction may not necessarily be the X-direction and may be an oblique direction having a predetermined angle. In this manner, the plugs are formed to be line-symmetric with respect to the first direction and the second direction, so that the movable weight portion 120A can move while keeping its balance when moving in the Z-direction.

As described above, the structure of the movable weight portion 120A of the embodiment includes the plurality of conductive layers 121B to 121D, the inter-layer insulating layers 122B and 122C, and the plugs 123B and 123C in the same manner as a typical IC cross-section. Therefore, the structure can be formed also by using the manufacturing steps of the integrated circuit portion 20A. In addition, the members formed also by using the manufacturing steps of the integrated circuit portion 20A are utilized for contributing to an increase in weight of the movable weight portion 120A.

Especially in the movable weight portion 120A formed also by using the IC manufacturing steps, the plugs 123B and 123C formed in the layers are devised so as to increase the mass of the movable weight portion 120A. As described above, since the plugs 123B and 123C formed in the layers include the two kinds of plug 123-X and plug 123-Y, the wall portions of the plug 123-X and the plug 123-Y can increase the weight. In a typical IC, since a plug is only aimed at connecting upper and lower wiring layers to each other, the plug has a columnar shape or a prismatic shape. In the embodiment, on the other hand, the plugs 123B and 123C are used for the purpose of increasing the mass of the movable weight portion 120A. Therefore, the shape thereof is apparently different. At least two conductive layers are required, and only one inter-layer insulating layer in which the plug is formed may be disposed.

In the embodiment, for further increasing the weight of the movable weight portion 120A, the inter-layer insulating layer 122A may be left on the lower surface of the conductive layer 121B of the lowermost layer. The inter-layer insulating layer 122A can prevent the conductive layer 121B as a movable electrode from being in contact with the fixed electrode 150A to cause short and can further increase the weight of the movable weight portion 120A. In addition, by forming the protective layer 122D that covers the conductive layer 121D of the uppermost layer, the weight of the movable weight portion 120A can be further increased.

For making the movable weight portion 120A movable in the Z-direction perpendicular to the substrate 101, a space needs to be formed for the movable weight portion 120A on the lower side thereof, in addition to the first gap portions 111 on the sides. Therefore, the conductive layer 121A below the conductive layer 121B as the lowermost layer of the movable weight portion 120A or below the inter-layer insulating layer 122A is removed by etching to form the second gap portion 112.

The movable weight portion 120A can include one or plurality of through holes 126 that vertically penetrate therethrough in a region where the plugs 123B and 123C are not formed. The through hole 126 is formed as a gas passage for forming the second gap portion 112 by an etching process. Since the movable weight portion 120A is reduced in weight by the amount of the through hole 126 to be formed, the hole diameter and number of the through holes 126 are determined in such a range that an etching process can be carried out. By forming the plugs 123B and 123C close to the through holes 126, the mass that is reduced locally due to the through holes 126 can be supplemented. Therefore, the movable balance of the movable weight portion 120A can be improved. When the plugs 123B and 123C are preferably formed around the through holes 126, the mass of the movable weight portion 120A can be further supplemented.

1.3. Connecting Portion

As described above, the connecting portions 130A are disposed for movably supporting the movable weight portion 120A in a region where the first gap portions 111 and the second gap portion 112 are respectively formed on the sides of and below the movable weight portion 120A. The connecting portion 130A is intervened between the fixed frame portion 110 and the movable weight portion 120A.

The connecting portion 130A is elastically deformable so as to allow the movable weight portion 120A to move in a weight movable direction (Z-direction) in FIG. 2B. In the same manner as the movable weight portion 120A, the connecting portion 130A is formed also by using the forming process of the integrated circuit portion 20A. In the embodiment, the connecting portion 130A provides spring properties as a cross-sectional structure having, for example, the conductive layer 121D of the uppermost layer in addition to the insulating layers 122B to 122D as shown in FIG. 2B.

1.4. Movable Electrode Portion and Fixed Electrode Portion

The embodiment is directed to the electrostatic capacitive acceleration sensor, which has the movable electrode portion 140A and the fixed electrode portion 150A with which the gap between the facing electrodes is changed by the action of acceleration as shown in FIGS. 1 and 2B. The movable electrode portion 140A is integrated with the movable weight portion 120A. The fixed electrode portion 150A is integrated with the substrate 101 supporting the fixed frame portion 110.

In the same manner as the movable weight portion 120A, the fixed electrode portion 150A is formed also by using the forming process of the integrated circuit portion 20A. That is, as shown in FIGS. 2B and 3, a well 40A is formed in the MEMS portion 100A in the same manner as the well 40 in the integrated circuit portion 20A. In the embodiment, the well 40A is used as the fixed electrode portion 150A. The fixed electrode portion 150A may have, on the surface of the well 40A, an insulating layer 41A that is formed in the same step and formed of the same material as the gate oxide film 41 of the integrated circuit portion 20A. The insulating layer 41A can prevent the well 40A as the fixed electrode portion 150A from being in contact with the conductive layer 121B as the movable electrode to cause short.

1.5. Detecting Principle of Acceleration Sensor

Figure 5:
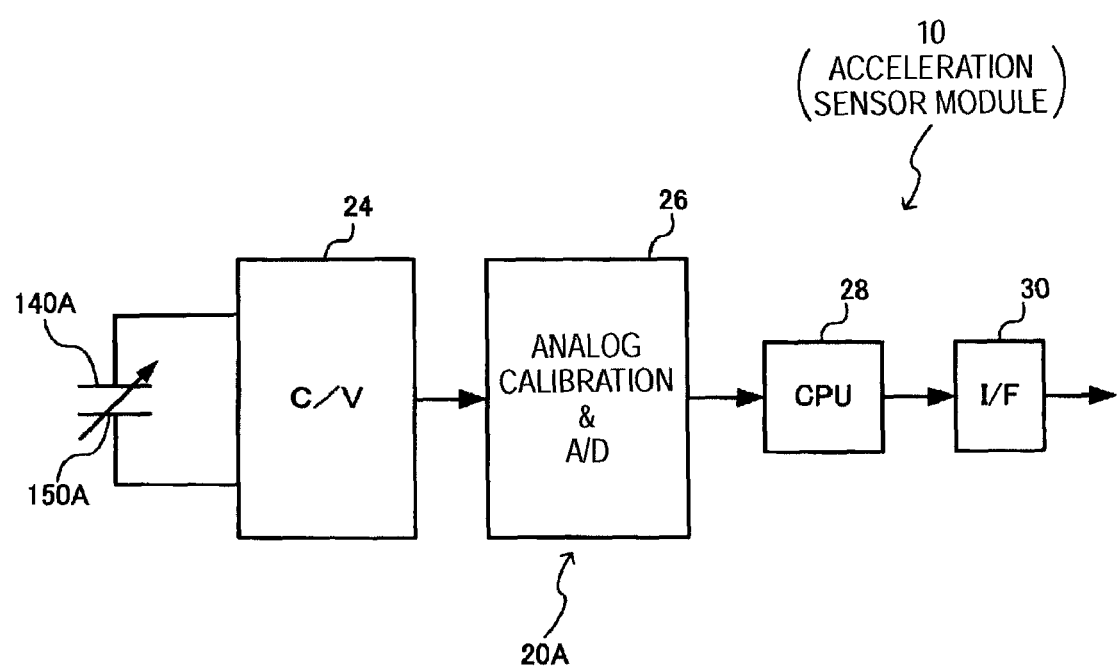
FIG. 5 is a block diagram of the acceleration sensor module.

FIG. 5 is a block diagram of the acceleration sensor module 10A of the embodiment. In the MEMS portion 100A, the movable electrode portion 140A and the fixed electrode portion 150A constitute a variable capacitor C. The potential of one electrode (for example, the fixed electrode portion) of the capacitor C is fixed to a reference potential (for example, a ground potential).

The integrated circuit portion 20A includes, for example, a C/V conversion circuit 24, an analog calibration and A/D conversion circuit unit 26, a central processing unit (CPU) 28, and an interface (I/F) circuit 30. However, this configuration is an example and is not restrictive. For example, the CPU 28 can be replaced by control logic, and the A/D conversion circuit can be disposed in the output stage of the C/V conversion circuit 24.

When acceleration acts on the movable weight portion 120A in a state where the movable weight portion 120A is stopped, force in a direction opposite to the acceleration acts on the movable weight portion 120A to change the gap of the movable and fixed electrode pair. For example, when it is assumed that the movable weight portion 120A is moved toward the upward direction in FIG. 2B, the gap between the movable electrode portion 140A and the fixed electrode portion 150A is increased. Since the gap and the capacitance are in an inverse relation, the capacitance value C of the capacitor C formed of the movable electrode portion 140A and the fixed electrode portion 150A becomes small. Conversely, when the movable weight portion 120A is moved toward the downward direction in FIG. 2B, the gap is decreased to increase the capacitance C. Along with the change in capacitance value of the capacitor C, the movement of charge occurs. The C/V conversion circuit 24 has a charge amplifier using, for example, a switched capacitor. The charge amplifier converts a minute current signal caused by the movement of charge into a voltage signal by sampling operation and integration (amplification) operation. A voltage signal (that is, a physical quantity signal detected by the physical quantity sensor) output from the C/V conversion circuit 24 is subjected to calibration processing (for example, adjustment of phase or signal amplitude, and low-pass filter processing may be further performed) by the analog calibration and A/D conversion circuit unit 26, and thereafter converted from an analog signal to a digital signal.

By using FIGS. 6A and 6B, the configuration and operation of the C/V conversion circuit 24 will be described. FIG. 6A shows the basic configuration of a charge amplifier using a switched capacitor. FIG. 6B shows voltage waveforms of respective parts of the charge amplifier shown in FIG. 6A.

As shown in FIG. 6A, the C/V conversion circuit has a first switch SW1 and a second switch SW2 (constituting a switched capacitor of an input part together with the variable capacitance C), an operational amplifier OPA1, a feedback capacitance (integral capacitance) Cc, a third switch SW3 for resetting the feedback capacitance Cc, a fourth switch SW4 for sampling an output voltage Vc of the operational amplifier OPA1, and a holding capacitance Ch.

As shown in FIG. 6B, the on/off of the first switch SW1 and the third switch SW3 is controlled by a first clock of the same phase, and the on/off of the second switch SW2 is controlled by a second clock having an opposite phase from the first clock. The fourth switch SW4 is briefly turned on at the end of a period in which the second switch SW2 is turned on. When the first switch SW1 is turned on, a predetermined voltage Vd is applied to both ends of the variable capacitance C, so that charge is accumulated in the variable capacitance C. In this case, the feedback capacitance Cc is in a reset state (state of being short-circuited between both ends) because the third switch is in the on state. Next, the first switch SW1 and the third switch SW3 are turned off, and the second switch SW2 is turned on, the both ends of the variable capacitance C are at a ground potential. Therefore, the charge accumulated in the variable capacitance C moves toward the operational amplifier OPA1. In this case, since the charge amount is stored, a relation of Vd·C=Vc·Cc is established. Accordingly, the output voltage Vc of the operational amplifier OPA1 is expressed by (C/Cc)·Vd. That is, the gain of the charge amplifier is determined by the ratio between the capacitance value of the variable capacitance C and the capacitance value of the feedback capacitance Cc. Next, when the fourth switch (sampling switch) SW4 is turned on, the output voltage Vc of the operational amplifier OPA1 is held by the holding capacitance Ch. Vo denotes the held voltage. The voltage Vo serves as the output voltage of the charge amplifier.

The above-described configuration of the C/V conversion circuit is an example, and the C/V conversion circuit is not restricted to the configuration.

1.6. Manufacturing Method

A method of manufacturing the acceleration sensor module 10A shown in FIG. 1 will be schematically described with reference to FIGS. 7 to 14. As shown in FIG. 7, the surface of a substrate, for example, the P-type silicon semiconductor substrate 101 is oxidized, and thereafter a field region is thermally oxidized using, as a mask, a nitride film or the like that is patterned by a photolithography step to form LOCOSs 42.

Figure 8:
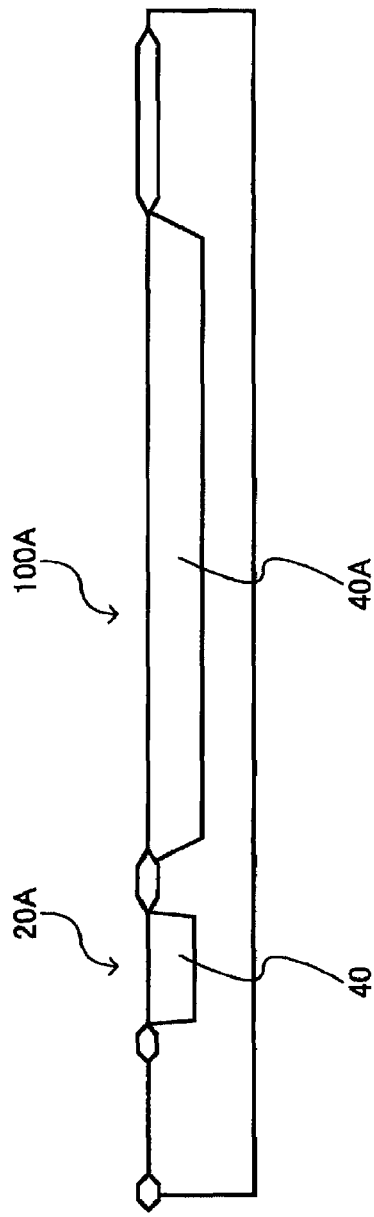
FIG. 8 shows a forming step of a well serving as a fixed electrode.

Next, as shown in FIG. 8, N-type wells (impurity layers) 40 and 40A, for example, having a different polarity from the substrate 101 are formed. When the impurity concentration of the well 40A on the MEMS portion 100A side is increased more than that of the well 40 on the integrated circuit portion 20A side to change the sheet resistance value, a forming step of the well 40A may be performed separately from a forming step of the well 40, or an additional step may be added after the formation of the well 40.

Figure 9:
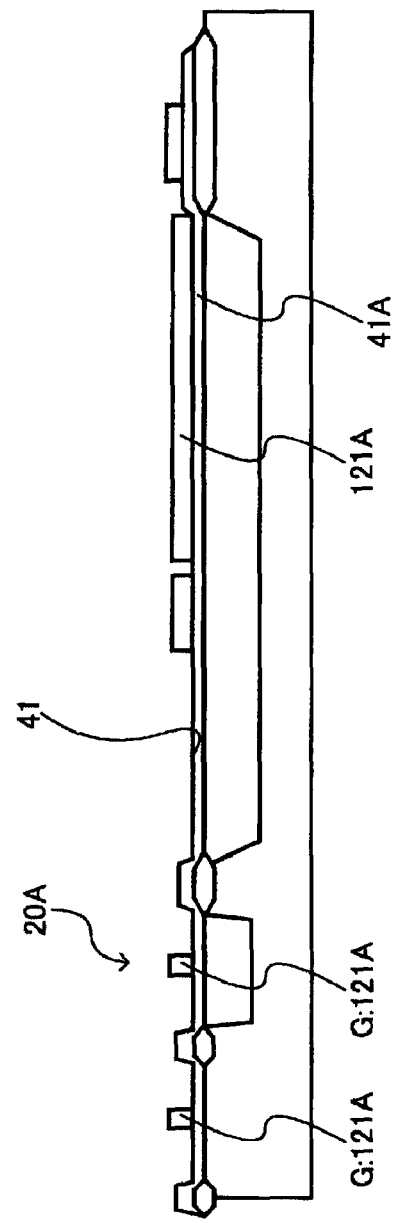
FIG. 9 shows a forming step of a first-layer conductive layer in the same layer as a gate electrode.

Next, as shown in FIG. 9, the entire surface of the substrate 101 is thermally oxidized to form the insulating layer (for example, an SiO$_2$ film) 41 serving as a gate oxide film. Further, the material of a first conductive layer, for example, polysilicon is deposited on the insulating layer 41 and etched by using a resist film that is patterned by a photolithography step to form the first conductive layer 121A. The formation of the first conductive layer 121A is carried out simultaneously with a forming step of the gate electrode G in FIG. 3. In the embodiment, a polysilicon layer Poly-Si is formed to a thickness of from 100 to 5000 angstrom by CVD (Chemical Vapor Deposition) and pattern etched by a photolithography step to form the first conductive layer 121A. The first conductive layer 121A can be formed of silicide or a high-melting-point metal in addition to polysilicon.

Figure 10:
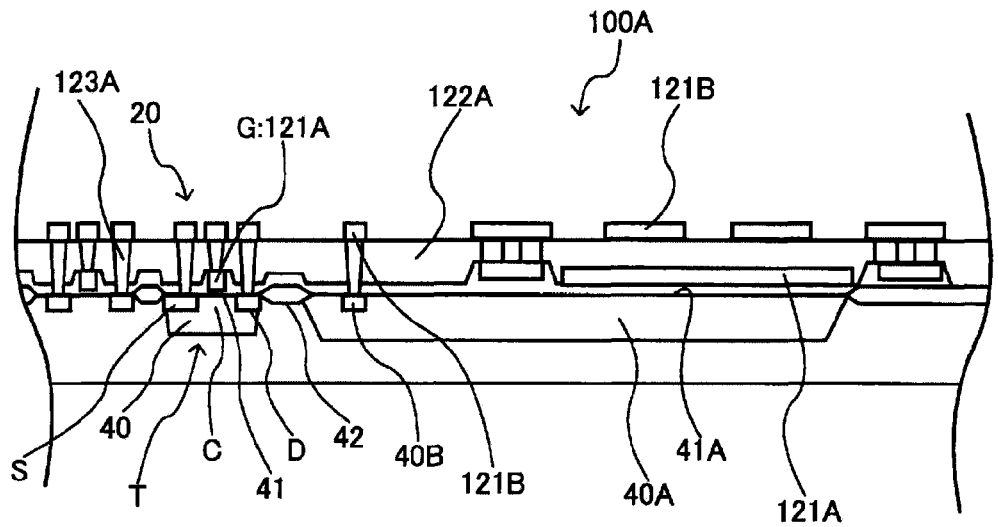
FIG. 10 shows a forming step of a second-layer conductive layer.

Next, as shown in FIG. 10, the source S and the drain D are formed in the well 40 by impurity implantation, and the channel C is formed between the source S and the drain D. In this case, a contact 40B may be formed in the well 40A. In this manner, N-type and P-type transistors T are formed in the integrated circuit portion 20A. Next, wiring is made for the transistors T, and by using the wiring layer, a wiring layer is formed also in the MEMS portion.

First, as shown in FIG. 10, an oxide film is deposited on the entire surface, and thereafter the inter-layer insulating layer 122A having contact holes formed by using a resist film that is patterned by a photolithography step is formed. The first-layer plug 123A is formed in the contact holes of the inter-layer insulating layer 122A. Further, the second conductive layer (first metal layer in the embodiment) 121B connected to the plug 123A is formed on the inter-layer insulating layer 122A.

In the embodiment, a material such as, for example, NSG, BPSG, SOG, or TEOS is formed to a thickness of from 10000 to 20000 angstrom by CVD to form the first inter-layer insulating layer 122A. Thereafter, the first inter-layer insulating layer 122A is pattern etched by a photolithography step to form a predetermined embedding groove pattern in which the first plug 123A is embedded to be formed. A material such as W, TiW, or TiN is embedded in the embedding groove pattern by sputtering, CVD, or the like. Thereafter, the conductive layer material on the first inter-layer insulating layer 122A is removed by etching back or the like to complete the first plug 123A. The first plug 123A may be flattened by performing a CMP (Chemical Mechanical Polishing) step. The plug 123A may be formed by sequentially sputtering, for example, barrier plating, a high-melting-point metal, for example, tungsten, and a cap metal. This enables the connection to the gate G, source S, and drain D of the transistor T and enables the wiring connection to the contact 40B in the well 40A of the MEMS portion 100A.

The second conductive layer 121B shown in FIG. 10 can be formed as a plural-layer structure in which Ti, TiN, TiW, TaN, WN, VN, ZrN, NbN, or the like is used as a barrier layer, Al, Cu, an Al alloy, Mo, Ti, Pt, or the like is used as a metal layer, and TiN, Ti, amorphous Si, or the like is used as an antireflection layer. The same materials as the second conductive layer 121B can be used also for forming the third and fourth conductive layers 121C and 121D. The barrier layer can be formed to a thickness of from 100 to 1000 angstrom by sputtering. The metal layer can be formed to a thickness of from 5000 to 10000 angstrom by sputtering, vacuum deposition, or CVD. The antireflection layer can be formed to a thickness of from 100 to 1000 angstrom by sputtering or CVD.

Figure 11:
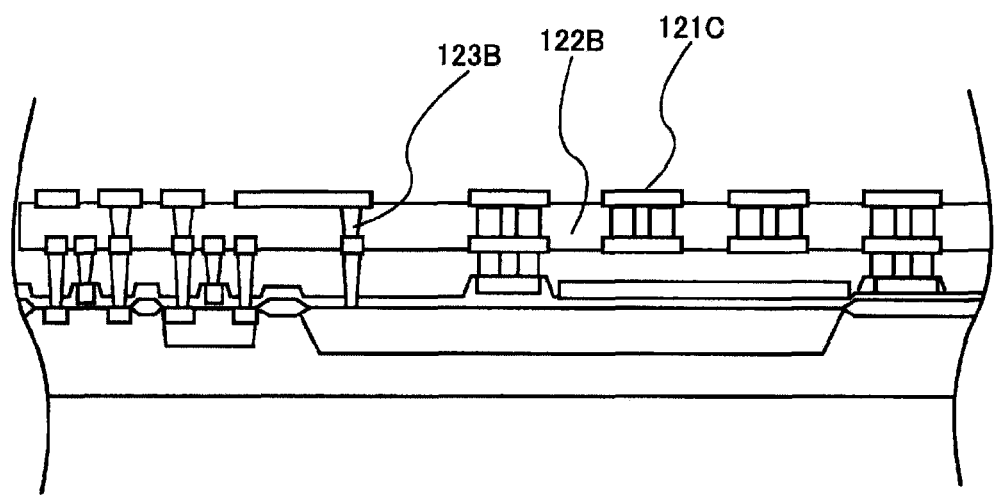
FIG. 11 shows a forming step of a third-layer conductive layer.

FIG. 11 shows forming steps of the second inter-layer insulating layer 122B, the second plug 123B, and the third conductive layer 121C. The forming step of the second plug 123B is carried out simultaneously with a contact step for the second conductive layer 121B in the integrated circuit portion 20A. After the steps shown in FIG. 10, the second inter-layer insulating layer 122B is formed in the same manner as the first inter-layer insulating layer 122A. Thereafter, the second inter-layer insulating layer 122B is pattern etched by a photolithography step to form a predetermined embedding groove pattern in which the second plug 123B is embedded to be formed. The same material as the first plug 123A is embedded in the embedding groove pattern by sputtering, CVD, or the like. Thereafter, the conductive layer material on the second inter-layer insulating layer 122B is removed by etching back or the like to complete the second plug 123B shown in FIG. 11. Planarization may be carried out by performing a CMP (Chemical Mechanical Polishing) step.

Next, the third conductive layer 121C is formed. The formation of the third conductive layer 121C is carried out simultaneously with a forming step of a second metal wiring layer in the integrated circuit portion 20A. The forming pattern of the third conductive layer 121C is substantially the same as that of the second conductive layer 121B in a region corresponding to the movable weight portion 120A.

Figure 12:
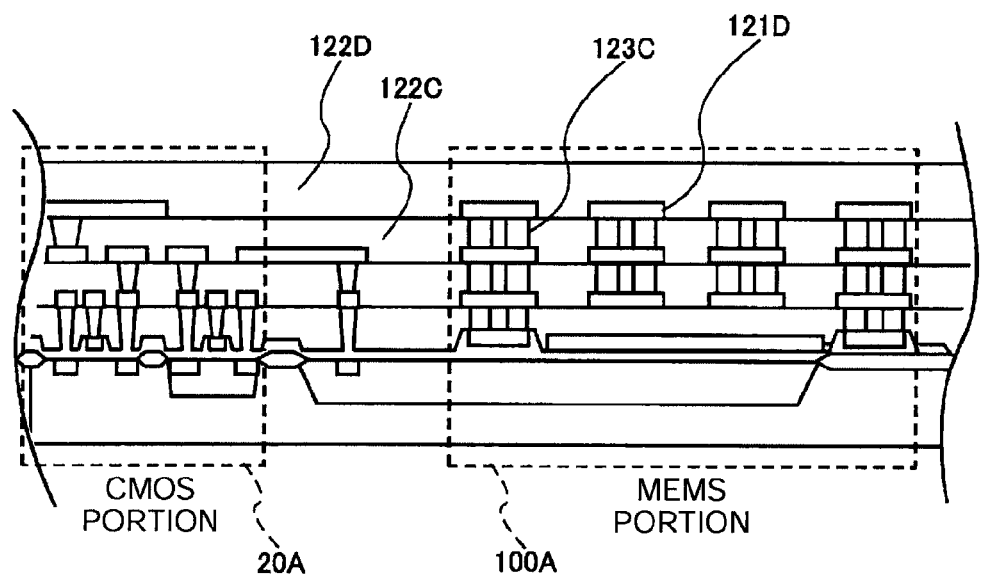
FIG. 12 shows a forming step of a fourth-layer conductive layer.

FIG. 12 shows the final step of film forming steps, showing forming steps of the third inter-layer insulating layer 122C, the third plug 123C, the fourth conductive layer 121D, and the protective layer 122D. After the steps shown in FIG. 11, the third inter-layer insulating layer 122C is formed in the same manner as the first and second inter-layer insulating layers 122A and 122B. Thereafter, the third inter-layer insulating layer 122C is pattern etched by a photolithography step to form a predetermined embedding groove pattern in which the third plug 123C is embedded to be formed. The same material as the first and second plugs 123A and 123B is embedded in the embedding groove pattern by sputtering, CVD, or the like. Thereafter, the conductive layer material on the third inter-layer insulating layer 122C is removed by etching back or the like to complete the third plug 123C shown in FIG. 12. Planarization may be carried out by performing a CMP (Chemical Mechanical Polishing) step. The plane pattern of the third plug 123C is substantially the same as that of the second plug 123B.

The formation of the fourth conductive layer 121D is carried out simultaneously with the forming step of a third metal wiring layer in the integrated circuit portion 20A. The forming pattern of the fourth conductive layer 121D is substantially the same as that of the second and third conductive layers 121B and 121C in the region corresponding to the movable weight portion 120A. In the embodiment, the fourth conductive layer 121D is drawn from a region corresponding to the connecting portion 130A over a region corresponding to the fixed frame portion 110 as shown in FIG. 2B, so that the fourth conductive layer 121D can be utilized as a wiring pattern for making the wiring connection to the integrated circuit portion 20A side. This causes the movable electrode portion 140A shown in FIG. 2B to be connected to the integrated circuit portion 20A via the conductive layers of the movable weight portion 120A and the connecting portion 130A. In this manner, when the MEMS monolithic configuration is achieved, connection by wire bonding is not required, but the shortest connection can be made by routing the wiring layer. Therefore, the wiring distance can be shortened to reduce the wiring capacitance, and sensing accuracy (noise resistance) can be improved. The protective layer 122D shown in FIG. 12 is formed by depositing, for example, PSiN, SiN, $SiO_2$, or the like to a thickness of from 5000 to 20000 angstrom by CVD.

In this manner, by using a part or entire of the plurality of conductive layers 121A to 121D, the plurality of inter-layer insulating layers 122A to 122C, the plurality of plugs 123A to 123C, the insulating layer 124, and the protective layer 122D, necessary for forming the CMOS integrated circuit portion 20A, the MEMS portion 100A can be formed.

Figure 13:
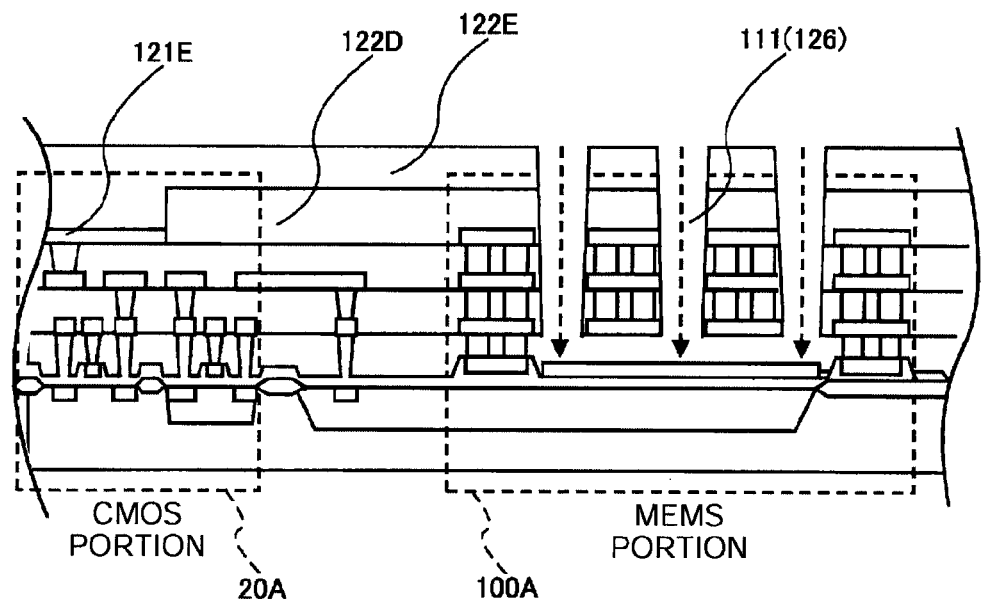
FIG. 13 shows an anisotropic etching step of insulating layers.

FIG. 13 shows an anisotropic etching step of the insulating films. In FIG. 13, a part of the protective layer 122D in the integrated circuit portion 20A is first removed by etching to expose the fourth conductive layer 121D, so that a pad is formed. Next, a resist film 122E is formed by coating on the protective layer 122D and patterned to form openings. FIG. 13 shows the state of the anisotropic etching performed by using the openings.

In the anisotropic etching, holes reaching from the surface of the protective layer 122D to the surface of the conductive layer 121A are formed. Therefore, the inter-layer insulating layers 122A to 122C and the protective layer 122D are etched. The etching step is insulating film anisotropic etching in which the ratio (H/D) of an etching depth (for example, 4 to 6 μm) to an opening diameter D (for example, 1 μm) is a high aspect ratio. With this etching, the first gap portions 111 that separate the fixed frame portion 110, the movable weight portion 120A, and the connecting portions 130A from one another are formed.

In the anisotropic etching, the plurality of holes 126 formed in the Z-direction in the movable weight portion 120A are preferably formed as shown in FIG. 2A. The holes 126 are useful in isotropic etching of the next step.

The anisotropic etching is preferably performed by using the conditions for etching a typical inter-layer insulating film between CMOS wiring layers. The processing can be carried out by performing dry etching using, for example, a mixed gas of $CF_4$, $CHF_3$, and the like. In this case, for example, the first conductive layer 121A as a polysilicon layer can be utilized as an etching stop layer.

Figure 14:
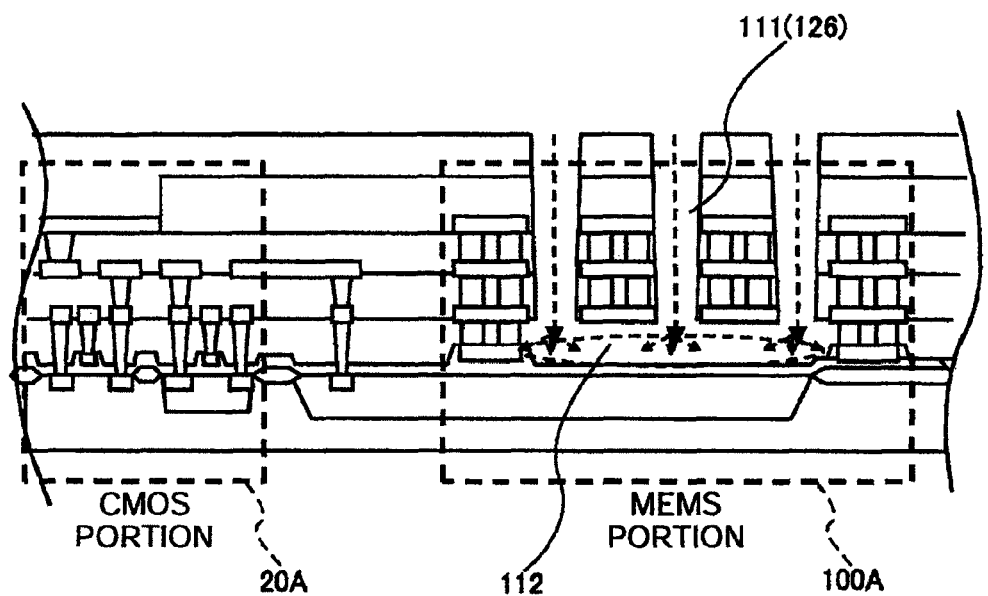
FIG. 14 shows an isotropic etching step of the first-layer conductive layer.

FIG. 14 shows a polysilicon isotropic etching step for forming the second gap portion 112. The isotropic etching step shown in FIG. 14 uses as openings the first gap portions 111 and the holes 126 formed in the anisotropic etching step shown in FIG. 13 to etch the first conductive layer (polysilicon layer) 121A situated below the movable weight portion 120A, the connecting portions 130A, and the movable electrode portion 140A. Examples of the isotropic polysilicon etching can include plasma etching using a chlorine-based gas and/or a fluorine-based gas ($CF_4$, $CCl_4$, $SF_6$, etc.).

1.7. Modified Examples

Figure 15:
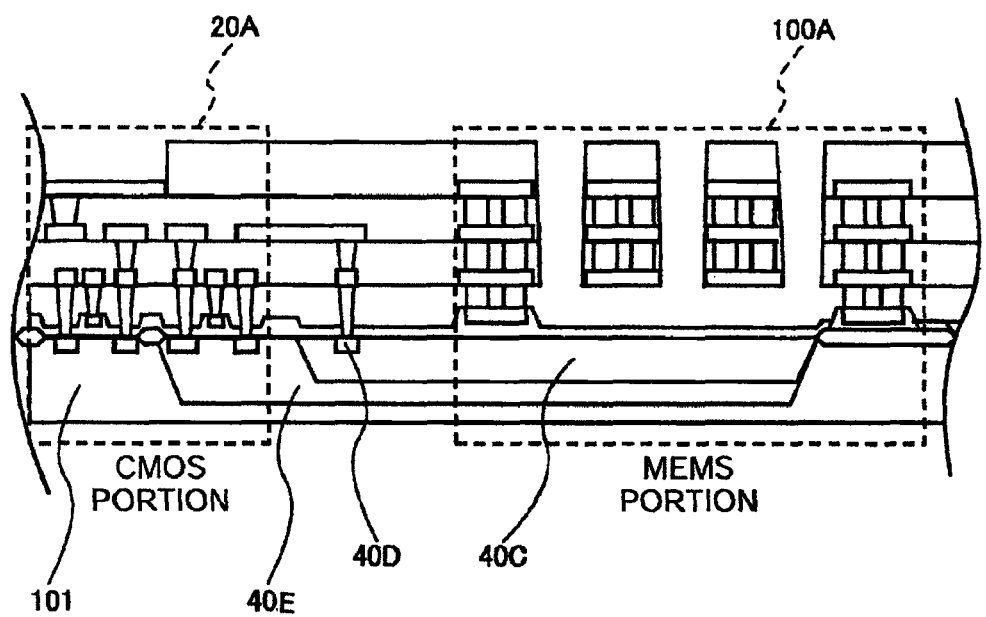
FIG. 15 shows a modified example in which the well structure of the fixed electrode portion is different.

In FIG. 15, the same P-type substrate 101 as in the embodiment is used, but the N-type well 40E is formed from the integrated circuit portion 20A over the MEMS portion 100A, and a P-type well 40C and a contact 40D are formed in the N-type well 40E of the MEMS portion 100A. In the embodiment, the P-type well 40C functions as the fixed electrode portion 150A.

In this manner, when the fixed electrode portion 150A of the MEMS portion 100A is formed of an impurity layer (well), the well may be of N-type or P-type, the well may have a single-layer structure (example of FIG. 3) or a multi-layer structure (example of FIG. 15), and the substrate may be of P-type or N-type.

When the fixed electrode portion 150A of the MEMS portion 100A is formed of an impurity layer (well), the polysilicon layer 121A as the first conductive layer is removed by isotropic etching to form the second gap portion 112. Therefore, the thickness of the polysilicon layer 121A affects the gap between the movable electrode portion 140A and the fixed electrode portion 150A. In the embodiment, the polysilicon layer 121A is formed in the same step as the gate electrode G of the integrated circuit portion 20A. In a usual gate electrode forming step in this case, since a polysilicon layer has a thickness of, for example, about 0.3 µm, which is thin, the polysilicon layer can be preferably utilized as the gap between the movable electrode portion 140A and the fixed electrode portion 150A. The capacitance C is proportional to S/g where S is the facing area as a capacitor, and g is the gap. Therefore, the area S can be made smaller as the gap g is reduced as long as the requirements specification is identical, thereby making it possible to miniaturize the MEMS portion 100A. In JP-A-2006-263902, on the other hand, since the thickness of a polysilicon layer of a MEMS portion is increased by a special step (about 2 to 3 µm), it is difficult to use the polysilicon layer in common with the CMOS circuit portion 20A.

Moreover, when the fixed electrode portion 150A of the MEMS portion 100A is formed of an impurity layer (well), the conductive layers of and above the second-layer conductive layer 121B can be utilized as the movable weight portion 120A. Therefore, compared to FIGS. 16A and 16B and FIGS. 17A and 17B which will be next described, the above-described case is excellent in that the mass of the movable weight portion 120A can be increased, provided that the total number N of conductive layers is identical.

Although the fixed electrode portion 150A is formed of the well in the above-described embodiment, this is not restrictive. FIGS. 16A and 16B and FIGS. 17A and 17B show various types of the fixed electrode portions 150A and the movable electrode portions 140A facing the fixed electrode portions. In any of FIGS. 16A and 16B and FIGS. 17A and 17B, N (N is an integer of 3 or more) conductive layers are formed on the substrate 101 of the integrated circuit portion 20A. When the stacked order of the conductive layers from the side close to the substrate 101 is defined as n (1≦n≦N−3), the fixed electrode portion 150A is formed of the material of a conductive layer of an nth layer formed in the integrated circuit portion 20A, and the movable electrode portion 140A is formed of the material of a conductive layer of an (n+2)th layer. That is, in any of FIGS. 16A and 16B and FIGS. 17A and 17B, a conductive layer of an (n+1)th layer is removed by isotropic etching, and the second gap portion 112 formed by the etching forms the gap of a capacitor. According to above-described configuration, the movable weight portion 120A can include a plurality of conductive layers and at least one layer of plug for connecting the conductive layers.

Figure 16A:
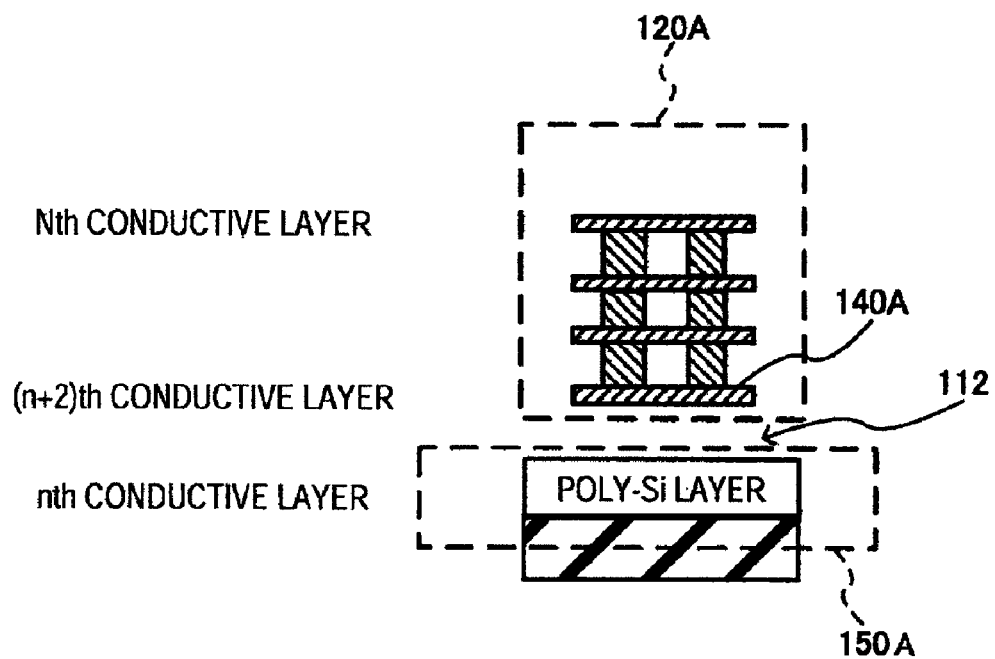
FIGS. 16A and 16B show modified examples of combination of a fixed electrode portion and a movable electrode portion.
Figure 16B:
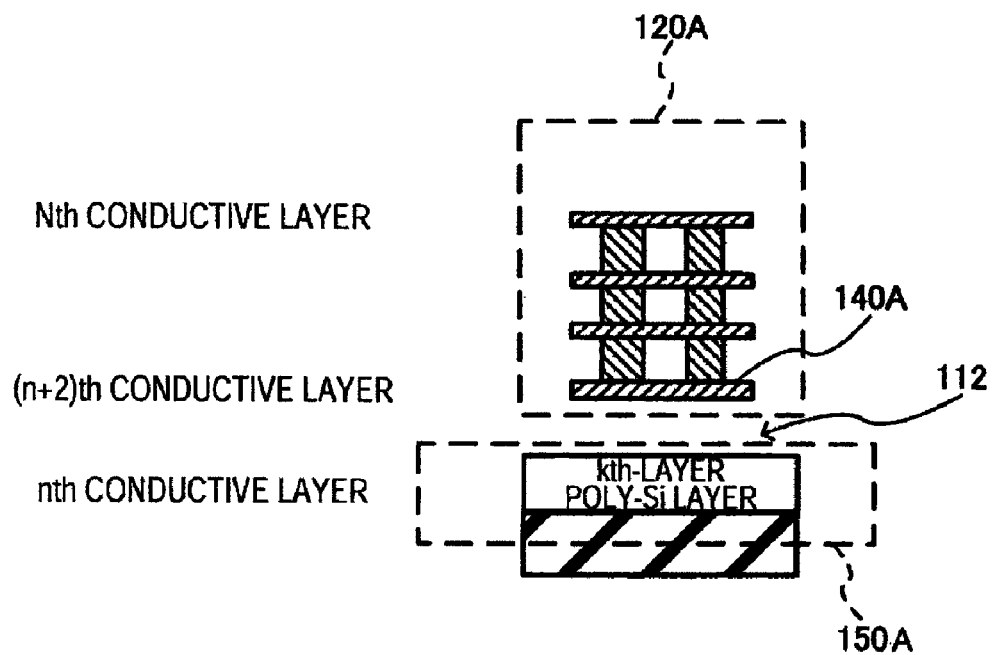

Specifically in FIG. 16A, a polysilicon layer (n=1: conductive layer of the first layer) in the same layer as the gate electrode G serves as a fixed electrode portion 150A, and the conductive layer (metal wiring layer) of the (n+2)th layer serves as the movable electrode portion 140A. FIG. 16B shows the case where a multi-layer polysilicon layer of two or more layers is included, in which a kth-layer polysilicon layer (conductive layer of the nth layer) other than the first layer shown in FIG. 16A is used as the fixed electrode portion 150A. In this case, the conductive layer (polysilicon layer or metal wiring layer) of the (n+2)th layer serves as the movable electrode portion 140A.

Figure 17A:
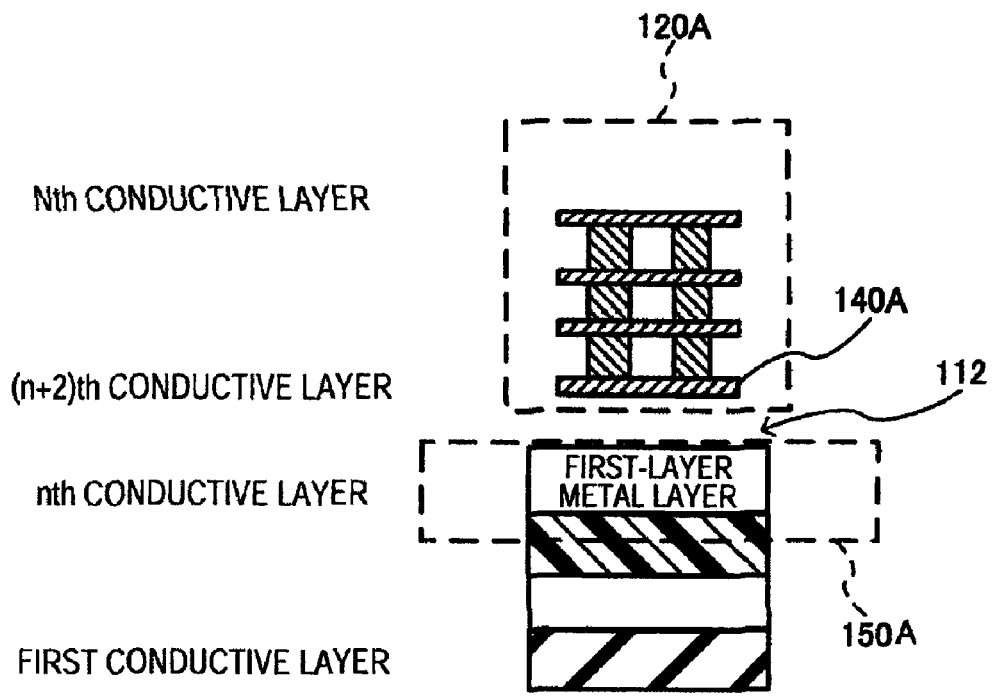
FIGS. 17A and 17B show other modified examples of combination of a fixed electrode portion and a movable electrode portion.
Figure 17B:
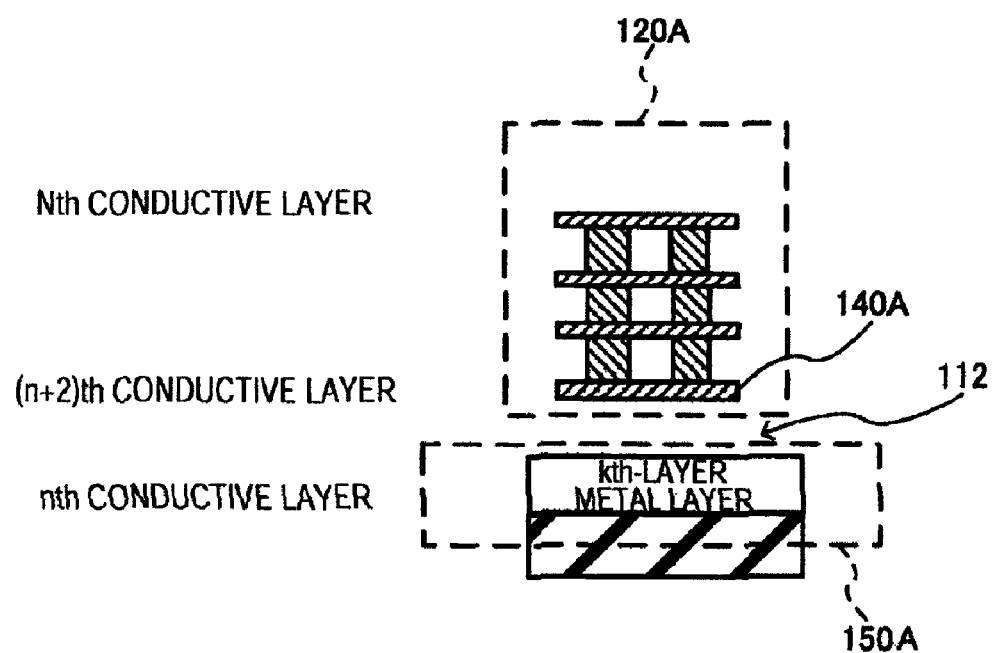

In FIG. 17A, a metal wiring layer of the first layer as the conductive layer of the nth layer serves as the fixed electrode portion 150A, and the conductive layer (metal wiring layer) of the (n+2)th layer serves as the movable electrode portion 140A. In FIG. 17B, a kth-layer metal wiring layer (conductive layer of the nth layer) other than the first layer shown in FIG. 17A is used as the fixed electrode portion 150A. In this case, the conductive layer (metal wiring layer) of the (n+2)th layer serves as the movable electrode portion 140A.

Among the examples of FIGS. 16A and 16B and FIGS. 17A and 17B, the example of FIG. 16A where the conductive layer of the lowermost layer is used as the fixed electrode portion 150A is excellent in that the mass of the movable weight portion 120A can be increased.

2. Second Embodiment

With reference to FIGS. 18 to 22, a second embodiment of the invention will be described. In the following description, only the differences between the first embodiment and the second embodiment will be described. An acceleration sensor module 100B according to the second embodiment is a tri-axial (X-, Y-, and Z-directions) acceleration sensor module to which the invention is applied. In the same manner as the first embodiment, a sensor chip and an IC chip can be integrally formed by a wafer process. In the second embodiment, the acceleration sensor 100B according to the embodiment has a movable weight portion 120B, different from the first embodiment where the MEMS portion 100A has the movable weight portion 120A.

The movable weight portion 120B is supported by a connecting portion 130B such that the movable weight portion can move in, in addition to the Z-direction orthogonal to the two-dimensional surface parallel to the substrate, at least one direction of orthogonal two axes X and Y on the two-dimensional surface. In the embodiment, the connecting portion 130B has four Z-direction elastic deformable portions 130BZ along first and second diagonal line directions a and b on a plane of the movable weight portion 120B. The Z-direction elastic deformable portion 130BZ has a larger width W1 than its thickness, so that the Z-direction elastic deformable portion 130BZ elastically deforms only in the Z-direction. In the middle of each of the two Z-direction elastic deformable portions 130BZ along the diagonal line direction a, a ring-shaped a-direction elastic deformable portion 130Ba having a hollow portion 130F is disposed. In the middle of each of the two Z-direction elastic deformable portions 130BZ along the diagonal line direction b, a ring-shaped b-direction elastic deformable portion 130Bb similarly having a hollow portion 130F is disposed. These a- and b-direction elastic deformable portions 130Ba and 130Bb deform in the a-direction and the b-direction due to change of the contour shape of the hollow portion 130F, so that the movable weight portion 120B can be moved in the X- and Y-directions.

The movable weight portion 120B has a first protruding movable electrode portion 140BX protruding in the Y-direction and a second protruding movable electrode portion 140BY protruding in the X-direction. The first protruding movable electrode portion 140BX and the second protruding movable electrode portion 140BY can also be referred to as a second movable electrode portion. The supporting portion 110 (not illustrated in FIG. 18) has first and second protruding fixed electrode portions 150BX and 150BY facing the first and second protruding movable electrode portions 140BX and 140BY. The first and second protruding fixed electrode portions 150BX and 150BY can also be referred to as a second fixed electrode portion. In the movable weight portion 120B, a movable electrode portion 140BZ that is formed in the same manner as the movable electrode portion 140A of the first embodiment is disposed so as to face a fixed electrode portion 150BZ that is formed in the same manner as the fixed electrode portion 150A of the first embodiment.

When the movable weight portion 120B moves in the X-direction, the facing distance between the first protruding fixed electrode portion 150BX and the first protruding movable electrode portion 140BX is changed to change a capacitance. When the movable weight portion 120B moves in the Y-direction, the facing distance between the second protruding fixed electrode portion 150BY and the second protruding movable electrode portion 140BY is changed to change a capacitance. Accordingly, acceleration in the X- and Y-directions can be detected in the same manner as the movable electrode portion 140BZ and the fixed electrode portion 150BZ having sensitivity in the Z-direction.

Figure 18:
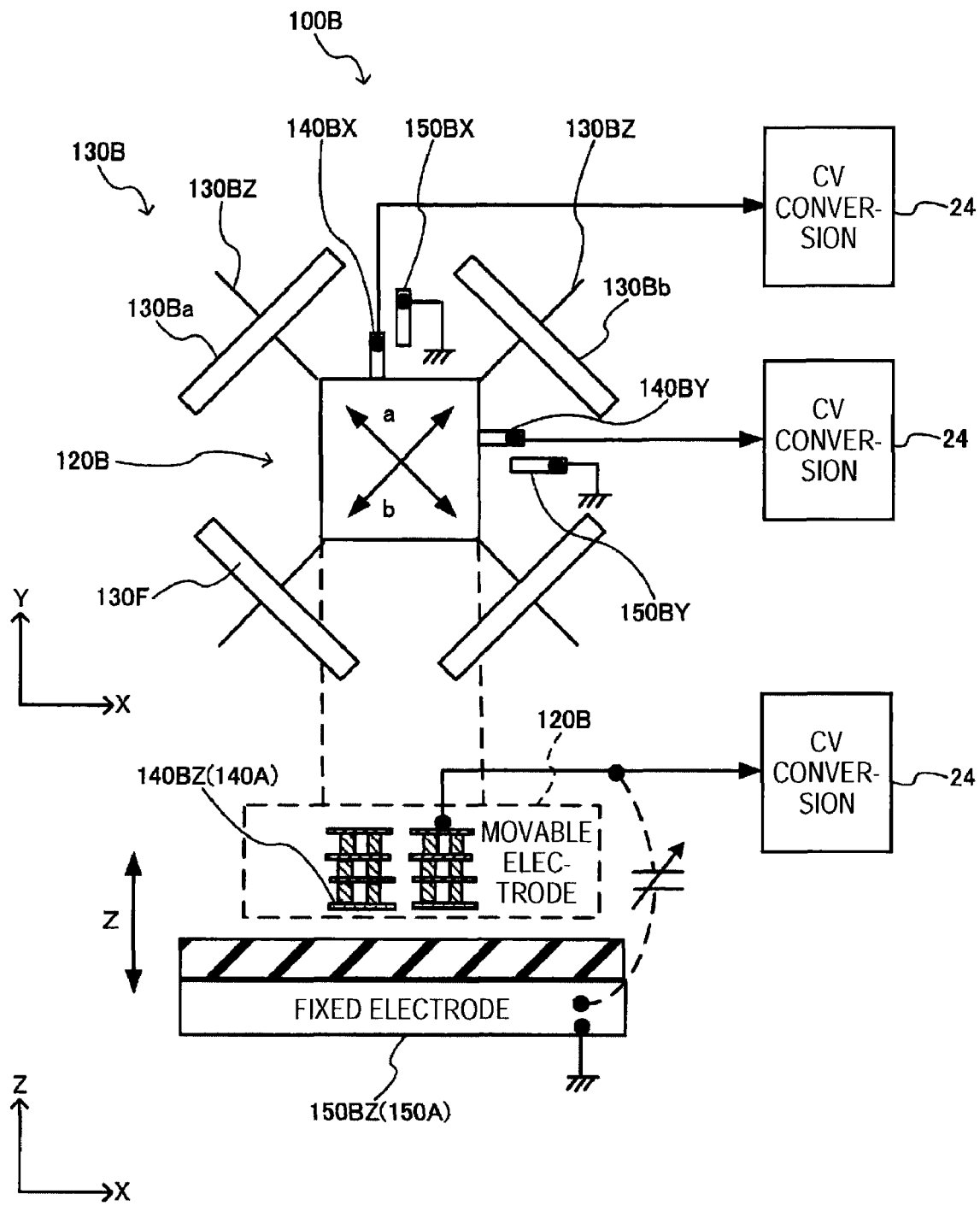
FIG. 18 shows an example of a second embodiment in which the invention is applied to a triaxial (X-, Y-, and Z-directions) acceleration sensor.

In FIG. 18, since the fixed electrode portion 150BZ and the first and second protruding fixed electrode portions 150BX and 150BY have the same potential (ground potential), the movable weight portion 120B can output three potentials corresponding to X, Y, and Z to the respective C/V conversion circuit 24. Conversely, the movable weight portion 120B may be set to a fixed potential to detect the three potentials corresponding to X, Y, and Z from the fixed electrode portion 150BZ and the first and second protruding fixed electrode portions 150BX and 150BY.

Figure 19:
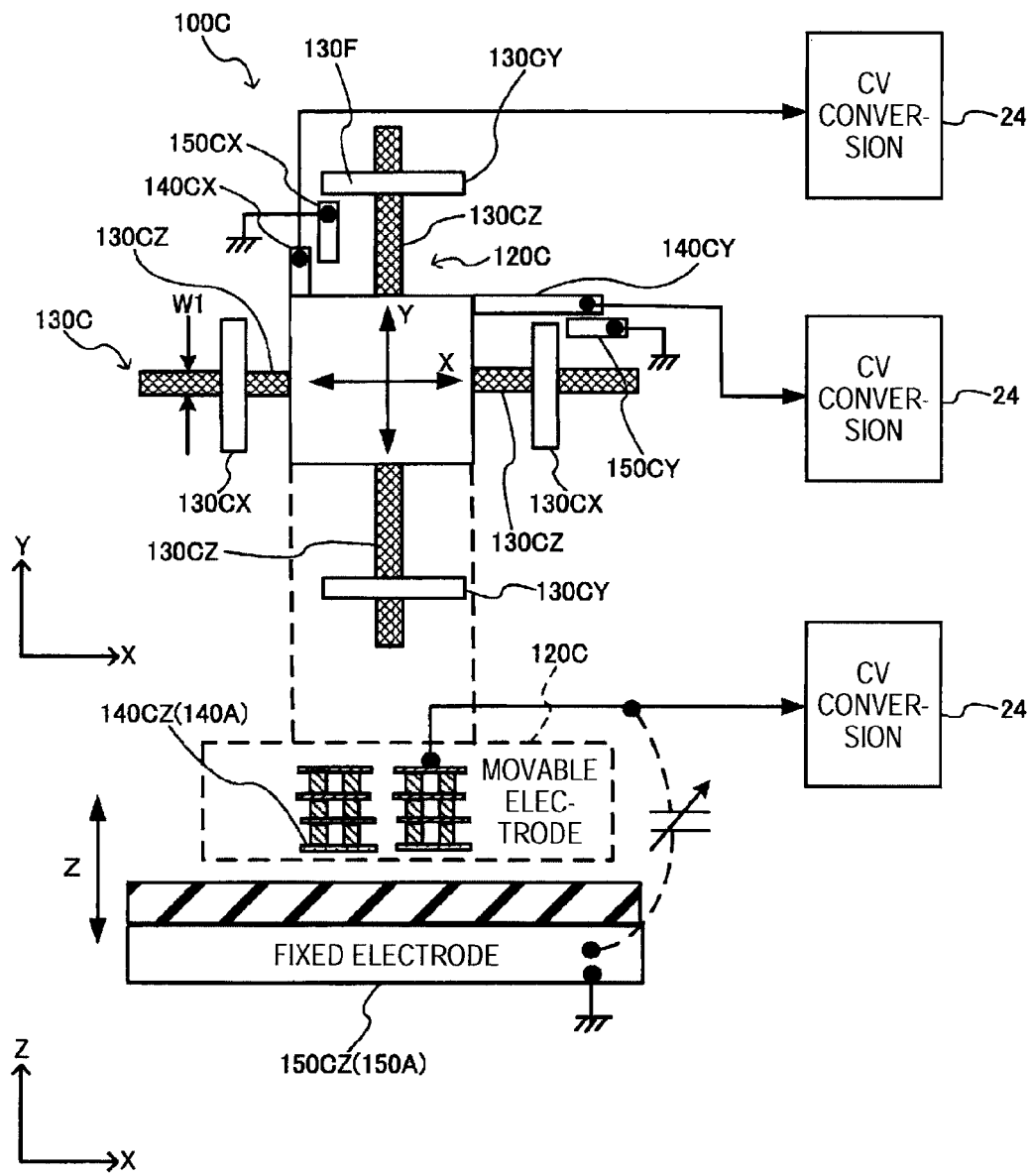
FIG. 19 shows another example of the second embodiment in which the invention is applied to a triaxial (X-, Y-, and Z-directions) acceleration sensor.

FIG. 19 shows an acceleration sensor 100C having a connecting portion different from that in FIG. 18. A connecting portion 130C supporting a movable weight portion 120C of the acceleration sensor 100C has four Z-direction elastic deformable portions 130CZ along X and Y. In the middle of each of the two Z-direction elastic deformable portions 130CZ along the X-direction, a ring-shaped X-direction elastic deformable portion 130CX having the hollow portion 130F is disposed. In the middle of each of the two Z-direction elastic deformable portions 130CZ along the Y-direction, a ring-shaped Y-direction elastic deformable portion 130CY similarly having the hollow portion 130F is disposed. Also in this case, acceleration in the X-, Y-, and Z-directions can be detected in the same manner as in FIG. 18.

Figure 20:
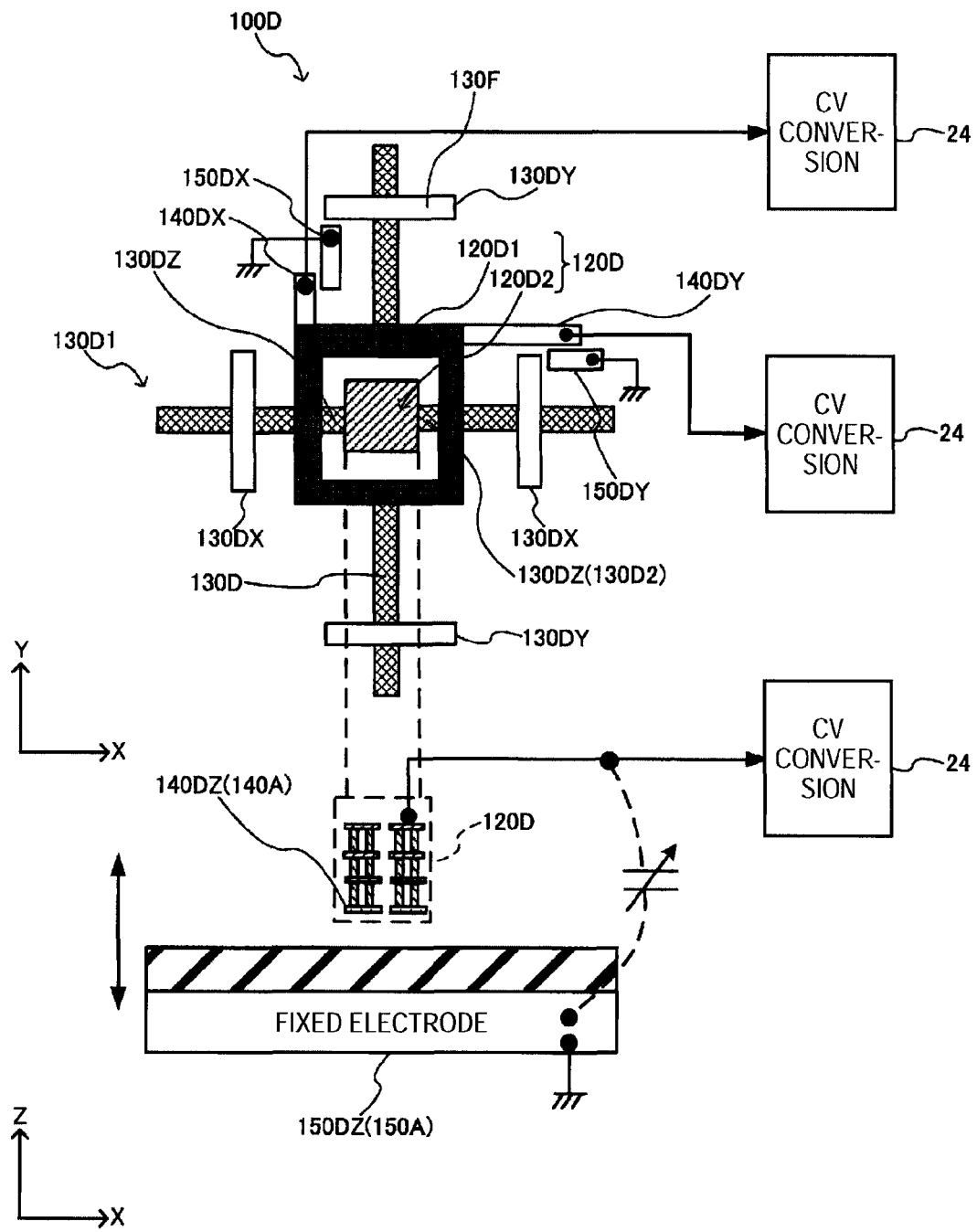
FIG. 20 shows still another example of the second embodiment in which the invention is applied to a triaxial (X-, Y-, and Z-directions) acceleration sensor.

FIG. 20 shows an acceleration sensor 100D having a movable weight portion 120D. The movable weight portion 120D is divided into an outer first movable weight portion 120D1 and an inner second movable weight portion 120D2. The first movable weight portion 120D1 can move in, for example, the X- and Y-directions via a first connecting portion 130D1 relative to the supporting portion 110 (not illustrated in FIG. 20). The second movable weight portion 120D2 can move in, for example, the Z-direction via a second connecting portion 130D2 relative to the first movable weight portion 120D1. Conversely, the outer first movable weight portion 120D1 may move in the Z-direction, and the inner second movable weight portion 120D2 may move in the X- and Y-directions.

The first connecting portion 130D1 has two rigid bodies 130D along each of the X- and Y-directions, that is, four rigid bodies in total. In the middle of each of the two rigid bodies 130D along the X-direction, a ring-shaped X-direction elastic deformable portion 130DX having the hollow portion 130F is disposed. In the middle of each of the two rigid bodies 130D along the Y-direction, a ring-shaped Y-direction elastic deformable portion 130DY similarly having the hollow portion 130F is disposed. The second connecting portion 130D2 is formed of, for example, two Z-direction elastic deformable portions 130DZ that are elastically deformable only in the Z-direction.

The first movable weight portion 120D1 has a first protruding movable electrode portion 140DX protruding in the Y-direction and a second protruding movable electrode portion 140DY protruding in the X-direction. The supporting portion 110 (not illustrated in FIG. 20) has first and second protruding fixed electrode portions 150DX and 150DY facing the first and second protruding movable electrode portions 140DX and 140DY. In the second movable weight portion 120D2, a movable electrode portion 140DZ that is formed in the same manner as the movable electrode portion 140A of the first embodiment is disposed so as to face a fixed electrode portion 150DZ that is formed in the same manner as the fixed electrode portion 150A of the first embodiment. Also in this case, acceleration in the X-, Y-, and Z-directions can be detected in the same manner as in FIGS. 18 and 19.

Figure 21:
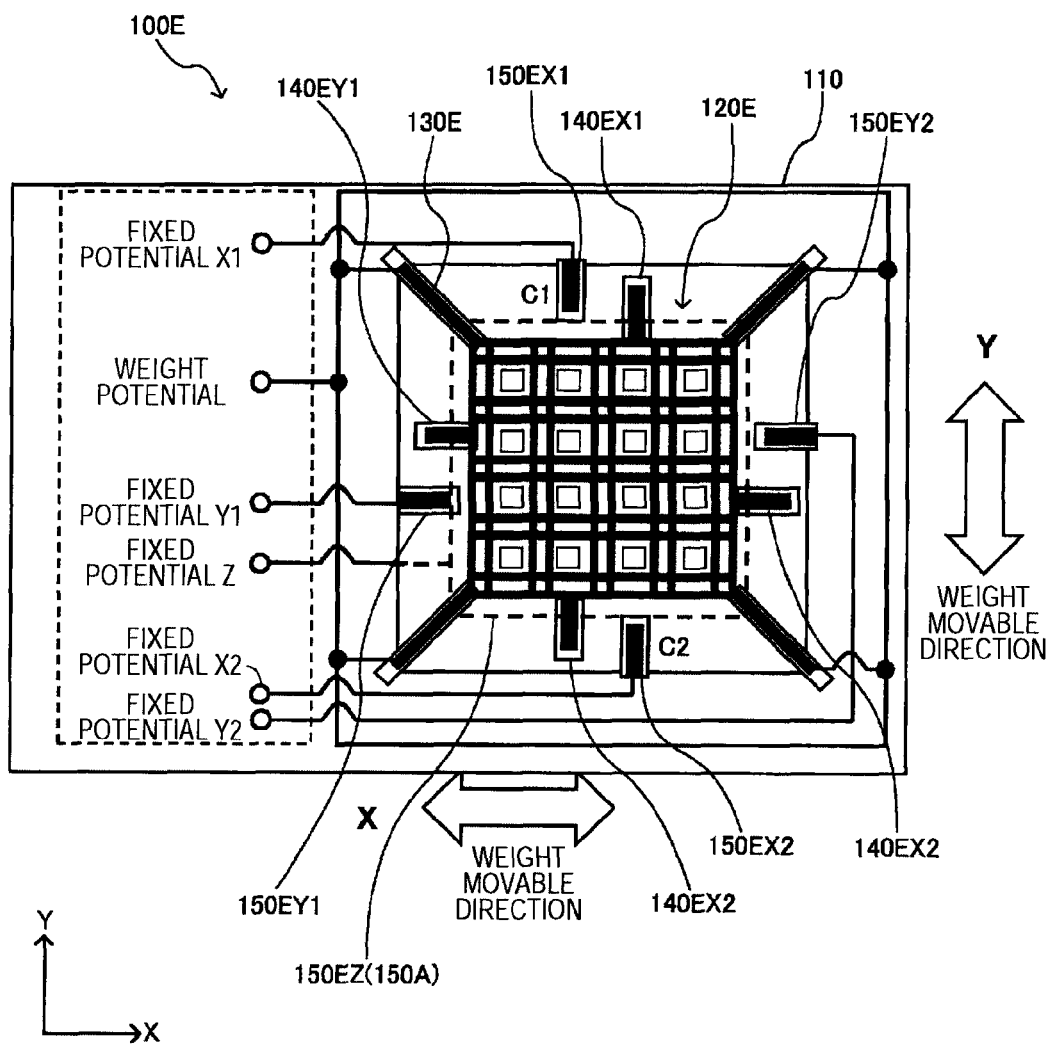
FIG. 21 shows further another example of the second embodiment in which the invention is applied to a triaxial (X-, Y-, and Z-directions) acceleration sensor.

FIG. 21 shows still another example in which electrode portions in the X- and Y-directions are modified. In FIG. 21, an acceleration sensor 100E has a movable weight portion 120E. The movable weight portion 120E and the supporting portion 110 have two sets of movable and fixed electrode pairs for each of the X- and Y-directions. For the X-direction, a first movable electrode portion 140EX1, a second movable electrode portion 140EX2, a first fixed electrode portion 150EX1, and a second fixed electrode portion 150EX2 are provided. The first movable electrode portion 140EX1 and the first fixed electrode portion 150EX1 constitute a capacitor C1. The second movable electrode portion 140EX2 and the second fixed electrode portion 150EX2 constitute a capacitor C2. The same is applied to the Y-direction.

In FIG. 21, when the movable weight portion 120E moves in the X-direction, one of two capacitances C1 and C2 increases while the other decreases. Whether which of the two capacitances C1 and C2 increases varies depending on the orientation of the X-direction (rightward or leftward orientation in FIG. 21). In the example of FIG. 21, therefore, in addition to the magnitude of a physical quantity, the direction in which the physical quantity acts can be easily detected.

Also in FIG. 21, in the movable weight portion 120E, the movable electrode portions for X, Y, and Z have a common potential (weight potential), and the potentials of the respective fixed electrode portions are input to the C/V conversion circuit 24. For each of the X- and Y-directions, the C/V conversion circuit 24 receives differential signals from the two capacitors C1 and C2. In this case, a differential charge amplifier as shown in FIG. 22, for example, can be used as the C/V conversion circuit 24.

Figure 22:
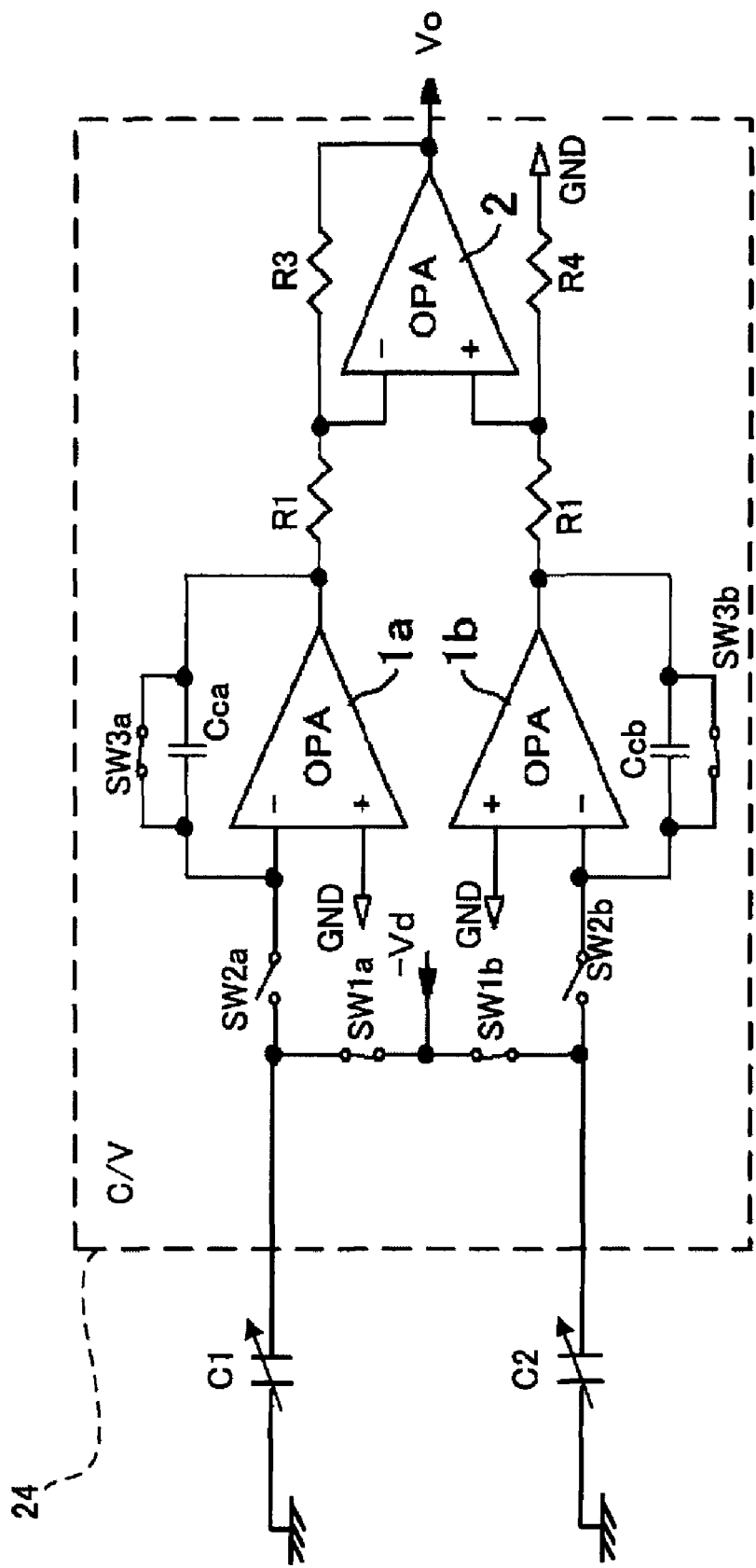
FIG. 22 shows an example of a C/V conversion circuit (charge amplifier) that performs C/V conversion of changes in two capacitances.

In the charge amplifier shown in FIG. 22, in the input stage, a first switched-capacitor amplifier (SW1$a$, SW2$a$, OPA1$a$, Cca, and SW3$a$) for amplifying a signal from the variable capacitance C1 and a second switched-capacitor amplifier (SW1$b$, SW2$b$, OPA1$b$, Ccb, and SW3$b$) for amplifying a signal from the variable capacitance C2 are disposed. Respective output signals (differential signals) of the operational amplifiers OPA1$a$ and OPA1$b$ are input to a differential amplifier (OPA2 and resistances R1 to R4) disposed in the output stage. As a result, the output signal Vo amplified is output from the operational amplifier OPA2. The use of the differential amplifier provides an effect that base noise can be removed.

The above-described configuration of the C/V conversion circuit is an example, and the C/V conversion circuit is not restricted to the configuration. For the convenience of description, only the two sets of and the four sets of movable and fixed electrode pairs are shown in FIGS. 18 to 20 and in FIG. 21, respectively. However, this is not restrictive. The number of electrode pairs can be increased corresponding to a required capacitance value. Actually, from several tens to several hundreds of electrode pairs are disposed, for example.

3. Modified Examples

Although the embodiments have been described above in detail, those skilled in the art should readily understand that many modifications may be made without substantially departing from the novel matter and effects of the invention. Accordingly, those modified examples are also included in the scope of the invention. For example, a term described at least once with a different term with a broader sense or the same meaning in the specification or the accompanying drawings can be replaced with the different term in any part of the specification or the accompanying drawings.

For example, the MEMS sensor according to the invention is not necessarily applied to an electrostatic capacitive acceleration sensor but can be applied to a piezo-resistive acceleration sensor. Moreover, the MEMS sensor is applicable as long as the sensor is a physical sensor that detects change in capacitance based on the movement of a movable weight portion. For example, the MEMS sensor can be applied to a gyro sensor, a pressure sensor, or the like. Moreover, the MEMS sensor according to the invention can be applied to electronic apparatuses such as digital cameras, car navigation systems, mobile phones, mobile PCs, and game controllers in addition to the embodiments. The use of the MEMS sensor according to the invention can provide an electronic apparatus having excellent detection sensitivity.

The entire disclosure of Japanese Patent Application No. 2009-106039, filed Apr. 24, 2009 and No. 2010-041693, filed Feb. 26, 2010 are expressly incorporated by reference herein.

What is claimed is:

1. A MEMS sensor comprising:
   a substrate;
   a fixed electrode portion formed the substrate;
   a movable weight portion formed above the fixed electrode portion via a gap;
   a movable electrode portion formed the movable weight portion and disposed so as to face the fixed electrode portion;
   a supporting portion; and
   a connecting portion that couples the supporting portion with the movable weight portion and is elastically deformable, wherein
   the movable weight portion is a stacked structure having a conductive layer and an insulating layer, and
   a plug having a larger specific gravity than the insulating layer is embedded in the insulating layer.

2. The MEMS sensor according to claim 1,
   the conductive layers are formed in plural numbers, and
   the insulating layer is formed between the plurality of conductive layers.

3. The MEMS sensor according to claim 2,
   the plug is conductive material and formed to penetrate through the insulating layer, and
   the conductive layers are connected to each other with the plug.

4. The MEMS sensor according to claim 1,
   the movable weight portion has a plane including a first direction and a second direction orthogonal to the first direction in a plan view, and
   the plug is formed to be line-symmetric with respect to both the first direction and the second direction.

5. The MEMS sensor according to claim 1,
   the movable weight portion has a through hole that penetrates from an uppermost layer to a lowermost layer, and
   the plug is formed close to the through hole.

6. The MEMS sensor according to claim 1,
   the movable electrode portion is formed by using the conductive layer.

7. The MEMS sensor according to claim 1,
   the movable electrode portion is covered with the insulating layer.

8. The MEMS sensor according to claim 1,
   an integrated circuit portion is formed on the substrate by using the stacked structure.

9. The MEMS sensor according to claim 8,
   the fixed electrode portion is formed by using the material of a gate electrode of a transistor formed in the integrated circuit portion.

10. The MEMS sensor according to claim 1, further comprising:
    a second movable electrode portion having an arm shape and extending from the movable weight portion; and
    a second fixed electrode portion having an arm shape, extending from the supporting portion, and disposed so as to face the second movable electrode portion.

11. An electronic apparatus having mounted thereon the MEMS sensor according to claim 1.

* * * * *